United States Patent
Cahoon et al.

(10) Patent No.: US 12,254,249 B1
(45) Date of Patent: Mar. 18, 2025

(54) MODELING COMPONENT LATENCIES IN DATA PROCESSING PIPELINES

(71) Applicant: Zoox, Inc., Foster City, CA (US)

(72) Inventors: Ryan Martin Cahoon, Mountain View, CA (US); James Graham Dolan, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 966 days.

(21) Appl. No.: 17/138,025

(22) Filed: Dec. 30, 2020

(51) Int. Cl.
 *G06F 30/27* (2020.01)
 *G07C 5/12* (2006.01)

(52) U.S. Cl.
 CPC ............. *G06F 30/27* (2020.01); *G07C 5/12* (2013.01)

(58) Field of Classification Search
 CPC .................................. G06F 30/27; G07C 5/12
 USPC ............................................................. 703/8
 See application file for complete search history.

(56) References Cited

U.S. PATENT DOCUMENTS

| | | | |
|---|---|---|---|
| 10,678,740 B1 | 6/2020 | Askeland et al. | |
| 2020/0134114 A1* | 4/2020 | Foreman | G06F 30/327 |
| 2020/0159685 A1* | 5/2020 | Askeland | G06F 11/34 |

OTHER PUBLICATIONS

Takahashi_2017 (A Gaussian mixture model for statistical timing analysis, 2009 46th ACM/IEEE Design Automation Conference, Jul. 2009) (Year: 2009).*

* cited by examiner

*Primary Examiner* — Brian S Cook
(74) *Attorney, Agent, or Firm* — Lee & Hayes, P.C.

(57) ABSTRACT

A controller may use a timing model to control and coordinate the execution of components within a data processing pipeline. The timing model may be generated based on log data collected during execution of the components, to model component latencies and pipeline behavior in a production environment. The controller may use the timing model to control the timing of the inputs to, the outputs from, and the execution of various interacting components in the data processing pipeline. The timing model may include component-specific and/or channel-specific timing data, and in various implementations may be based on inputs provided to the components, the timing and contents of outputs from the components, and/or the number of times particular code is executed within the components.

20 Claims, 9 Drawing Sheets

US 12,254,249 B1

MODELING COMPONENT LATENCIES IN DATA PROCESSING PIPELINES

BACKGROUND

Computing systems may use data processing pipelines to analyze complex data and control the operation of various processes and systems. Within a data processing pipeline, multiple components may execute individually and may interact via input and output communications to process data and perform complex operations. Individual components within a data processing pipeline may receive input data from upstream components, execute component-specific software to process the input data, and provide output data to downstream components in the pipeline. Data processing pipelines also may include one or more controllers configured to initiate execution of the components, set internal states of the components, and route input/output messages between components.

Monitoring the operation and performance of complex data processing pipelines may be difficult because changes in one component may cause unexpected effects on downstream components. Further, the behavior and output of a data processing pipeline may depend on the inputs provided to the pipeline, and also on the computing environment in which the pipeline is executed. For instance, depending on the computing resources available, the configuration, and other factors of the computing environment, different latencies may be observed by the messages or other interactions between components, and these differences may propagate downstream to affect the behavior and outputs of the pipeline. The differences in component latencies when executing data processing pipelines in different computing environments thus presents challenges for component testing and simulation, as well as for portability of data processing pipelines between systems.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
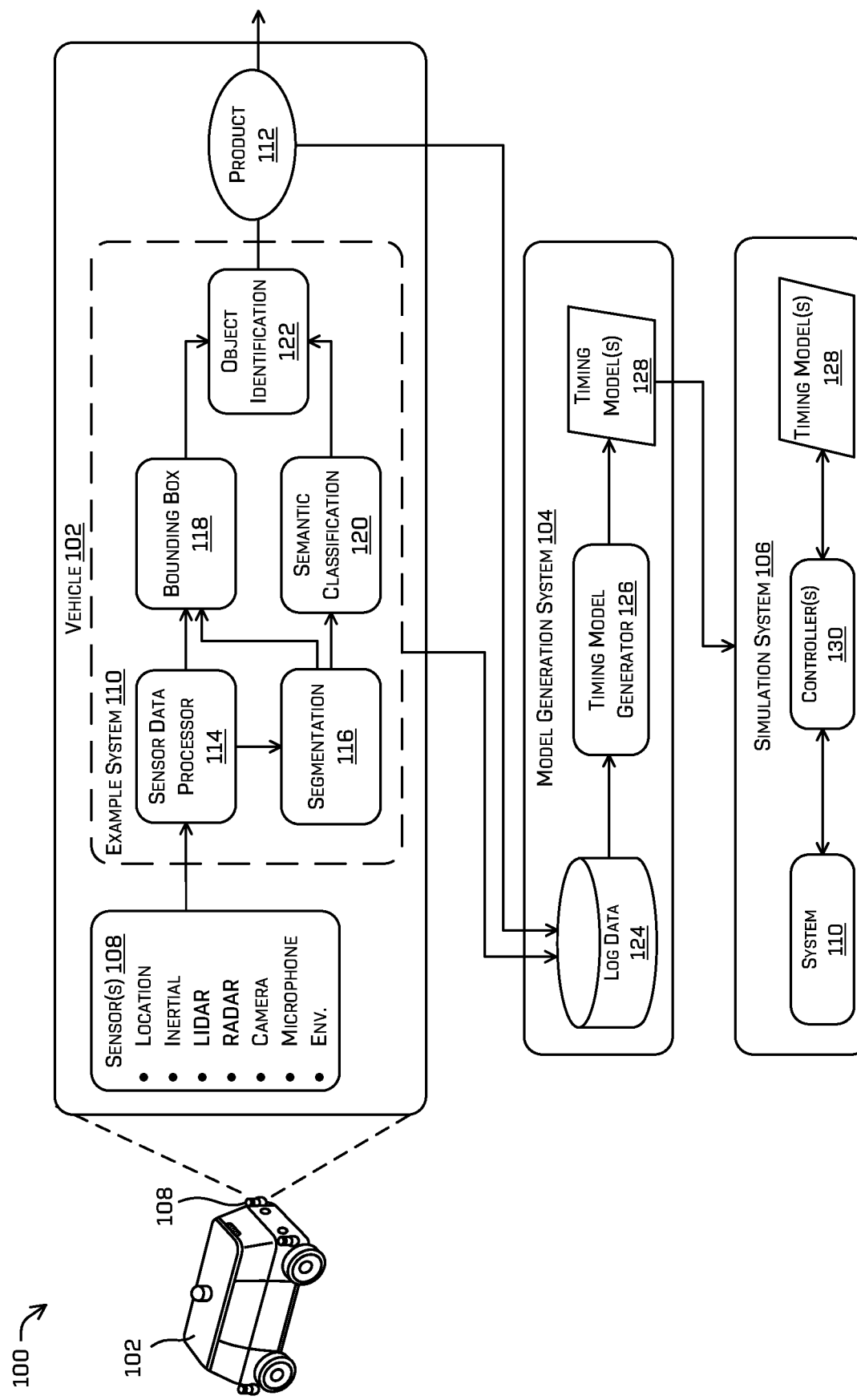
FIG. 1 is a block diagram illustrating an example computing environment for generating and using timing models to control the execution of components within data pipelines, in accordance with implementations of the disclosure.

As discussed above, component latencies within a data processing pipeline present challenges for testing the data pipeline components and performing simulations that include executing the data pipeline. For instance, during testing and simulation of the components of the data processing pipeline, a high level of behavioral similarity may be desirable for the outputs and behaviors of the data processing pipeline, in comparison to the outputs and behaviors of the pipeline when executing in online systems within production environments. However, testing and simulation systems may use large amounts of compute and memory resources and may operate in dedicated computing environments. Such environments may provide increased computational efficiency to allow for robust and large-scale simulations, but also may reduce component latencies within the data processing pipeline, which may cause error and inconsistencies in the operation of the pipeline. This application relates to generating and using timing models to control the execution of components and input/output messages within a data processing pipeline. The timing model may be generated based on log data collected from the data processing pipeline executing in an online system and/or production environment. For example, a timing model may indicate the execution times or durations of the different components in a data pipeline, and/or the times or durations during the component executions that products were output by the components. A controller may use the timing model to control the times at which the outputs from upstream components are provided as inputs to downstream components. In some examples, the timing model may include timing data associated with different components, different communication channels supported by the data processing pipeline, and/or different combinations of components and communication channels.

The techniques described herein for generating and using timing models for data processing pipelines (or "data pipelines") may be applied to various types of systems in different technical fields. In some examples, data pipeline timing models may be used to control testing and simulation systems for autonomous vehicles. To illustrate, a system of an autonomous vehicle may comprise an artificial intelligence (AI) stack that comprises multiple systems such as a perception system, a prediction system, a planning system, a collision avoidance system (CAS), a remote teleoperations system, a drive module control system, an internal operations system, etc. Each of these systems may comprise tens, hundreds, or even thousands of components which may interact with other components in a data pipeline architecture. A perception system, for example, may include one or more sensor data processing components, component(s) for segmenting an image, component(s) for segmenting points of LIDAR data, component(s) for classifying object identified in sensor data, component(s) for determining size, position, velocity, and other attributes of the component(s), component(s) for tracking an object, and so on. Moreover, any or all of these components may include a plurality of sub-components such as neural network(s) and/or other machine-learned models, instructions executable by a processor, and/or hardware.

Additionally, although certain examples refer to software components, the techniques described herein may apply to various types of data pipelines including different types of components. For instance, the data pipelines described herein may include certain component(s) implemented in software executed by a processor, other component(s) implemented as hardware such as a field-programmable gate array (FPGA) and/or an application-specific integrated circuit (ASIC), etc. Additionally or alternately, the components within a data pipeline may be implemented in a kernel layer of an operating system, an application layer of the operating system, and/or an application layer of a different operating system. A data pipeline may any combination of the components described herein, and each component may vary in the functions performs, inputs received, and outputs provided by the component.

Systems described herein for executing data pipelines may include one or more controllers configured to support and manage interactions between the components in the data pipeline. Such controllers, which may be implemented within a data pipeline or separately outside of the data pipeline, may provide signals to an I/O interface of the components in the pipeline. In some examples, a controller may be the destination and source of all I/O functions of a component, and/or may initiate the execution of the component. Additionally or alternatively to controlling the inputs and/or outputs to the component, the controller may control the execution state of the component, including causing the component the execute at particular times, prevent execution of the component, controlling when and/or how long the component executes, causing internal states of the component to be set to specified internal states, etc. In some cases, a controller associated with a component in a data pipeline may cause the component to execute periodically, such as at 30 MHZ, 500 MHZ, 1 GHZ time intervals, etc. In such cases, when the execution of a component is initiated, the component may process all input message(s) have been received (e.g., at one or more input queues or channels) from all upstream components to which the component subscribes, since the last execution of the component.

As used herein, a "product" and an "output" (in its uses as a noun) may be used interchangeably to refer to an output of an execution of a component and/or an output of a system. For example, a component within a data pipeline may output an output/product responsive to executing. This output/product may be output by a system implementing the data pipeline as an output/product, and/or this output/product may be received by a second component of the data pipeline that may generate a second output/product. The system may additionally or alternatively output the second output/product. Use of the word "product" thereby avoids a confusing situation where a component may output (verb) via an output interface an output (noun).

Certain techniques described herein relate to generating and/or training timing models to control the execution timing of components in a data pipeline, based on log data associated with previous executions of the same components. For instance, the model generation component may receive log data from systems executing the data pipeline in production environments. In some cases, the controller(s) of the data pipeline may save events occurring at the components as log data within log files and/or log data stores. For example, a controller of a data pipeline may save a sequence of events indicating which components in the data pipeline were executed, the times at which each component execution was initiated, the input(s) provided to the components associated with each component execution, the outputs produced by the components during each component execution, and the absolute and/or relative times at which the outputs were produced during each component execution. Additionally or alternatively, the controller(s) of a data pipeline may save as log data any non-deterministic values provided as input to the component by the controller, such as system timestamp data used by the component or random numbers generated by the component during execution, diagnostic information regarding execution of the component, and/or data indicating the internal state of the component when the component was executed.

Based on the log data, the model generation system may generate and/or train one or more timing models for the components in the data pipeline. As an example, for data pipelines associated with autonomous vehicles, a log data file or repository may include a sequence of events captured by a controller during online operation of the autonomous vehicle as the vehicle traverses through a physical or simulated environment.

As described above, log data collected during online executions of a data pipeline in a production environment may produce outputs that are affected by the available computing resources and configuration of the computing environment. For instance, the outputs produced by the components of a data pipeline executing online within an autonomous vehicle may depend on the computing resources and memory available on the autonomous vehicle, the configurations of the hardware, software and network components on the vehicle, the other systems executing on the vehicle at the same time, etc. As described below in more detail, the log data collected during online operations in production environments may include the necessary data to reproduce the online operations in a similar or identical manner on separate systems (e.g., a simulation system) having different resources and computing environments.

In various implementations, the model generation system may use different techniques, alone or in combination, to generate timing models associated with the components in a data pipeline. A timing model may include timing data that indicates the execution times (e.g., execution durations) of one or more components in a data pipeline, and/or the relative times during the execution of the components that products were output by the components. In some cases, a component may output a product (e.g., an output message) only when it terminates execution, in which case the execution time of the component may be same as the product output time. However, in other cases, a component may output multiple products at various times during its execution and/or when it terminates execution. As noted above, components also may output products via multiple communication channels (which also may be referred to as network channels or topics). In such cases, the timing model for a component may be generated based on the previous component execution times, termination times, and/or product output times, some or all of which may be received from the log data associated with the component.

As an example, the aggregated log data for a component of a data pipeline may indicate that the component was executed a first time at time to based on an instruction from a controller, output a first product (e.g., an output message via a first communication channel) at time $t_1$ 25 ms after time to, output a second product (e.g., a second output message via a second communication channel) at time $t_2$ 35 ms after time $t_0$, and terminated execution at time $t_3$ 40 ms after time $t_0$. In this example, the log data may indicate that the same component was executed a second time $t_4$ based on another instruction from the controller, output a first product via the first channel at time $t_5$ 18 ms after time $t_4$, output a second product via the second channel) at time $t_6$ 22 ms after time $t_4$, and terminated execution at time $t_7$ 29 ms after time $t_4$. A timing model generated based on this example for the component may be based on the durations of the total component execution time, which may be calculated based on the previous execution times of the component (e.g., $t_3$-$t_0$ and $t_7$-$t_4$). The timing model also may include time durations corresponding to the times during execution when the component output the first product via the first channel, which may be determined based on the previous output times via the first channel (e.g., $t_1$-$t_0$ and $t_5$-$t_4$), and when the component output the second product via the second channel, which may be determined based on the previous output times via the second channel (e.g., $t_2$-$t_0$ and $t_6$-$t_4$), etc.

In some examples, a model generation system may determine timing models based on the average time durations for product output times by a component, as indicated in the log data. For instance, the log data received for a component may indicate in that in ten previous executions, the component output a product via a first communication channel at the following times after the initiation of the component execution: 12 ms, 18 ms, 9 ms, 17 ms, 28 ms, 6 ms, 33 ms, 26 ms, 18 ms, and 10 ms. In this example, the model generation system may calculate the average of the product output times, to determine an average product output time of 17.7 ms after the component execution is initiated by a controller. Although this example describes an average based on ten previous product output times retrieved from log data, in other examples the log data may include hundreds or thousands of records associated with previous executions of a component in a production environment. As discussed below, when a timing model includes average product output times for a component, a controller within a simulation system (or other system implementing the component or pipeline in a separate computing environment), may retrieve and use the average product output times for the component to manage the timing of inter-component communication within the simulation.

In other examples, the model generation system may generate a probability distribution based on the previous product output times retrieved from the log data associated with the component. In various instances, the model generation system may model the product output times for a component as a Gaussian and/or non-Gaussian distribution (e.g., a Poisson distributions, multi-modal distribution, etc.), and the timing model may store one or more distributions associated with a component. As discussed below, when a timing model includes probability distribution(s) for a component, a controller within a simulation system may retrieve and sample from the probability distribution(s) to determine product output times to be used for the component in the simulation. In some examples, the model generation system can include a machine-learned model with parameters trained to simulate outputs times that can vary based on one or more parameters (e.g., a temperature, a processor's availability/idle state, a type of input, etc.) associated with a corresponding pipeline component.

Additionally or alternatively, the model generation system may generate a timing model for a component that includes timing data for the product output times, based on the inputs provided to (or otherwise available to) the component when the component was executed. As noted above, a component may be executed multiple times (e.g., periodically) by a controller with the data pipeline is used in a production environment, and during each execution the component may receive and process any input(s) received from upstream components since its previous execution. In such examples, each execution of a component may receive different numbers, types, and complexity of inputs during different executions, and the model generation system may analyze the log data to determine the product output times for the component as a function of its execution inputs. For instance, a timing model for a component may include a first average product output time when the component executes with zero new input messages, a second average product output time when the component executes with one new input message, a third average product output time when the component executes with two new input messages, and so on. In other examples, a timing model for a component may include multiple different probability distributions of product output times (instead of or in addition to average product output times) which may be associated with different numbers of input messages for a component execution.

Within the timing model, averages and probability distributions for the product output times of a component may be determined based on the number of new input messages received since the last component execution, and/or based on various attributes of the input data variables. For instance, the model generation system may determine the number of input messages, and may determine various attributes such as the source of the input data (e.g., an identifier of an upstream component), a channel or topic of the input data, the size of the input variables, the type of the input variables, and/or the complexity of the input variables, etc. The model generation system may use statistical or heuristic techniques, and/or machine-learning models, regression analyses, and the like, to generate timing models for the components that may include multiple time values and/or distributions based on the different numbers/types/attributes of the input data. To illustrate for a perception system of an autonomous vehicle, the model generation system may determine, for a component in the perception system, different timing data (e.g., an average product output time or distribution of product output times) associated with different numbers of objects detected by the vehicle, different types of the objects (e.g., cars, pedestrians, bicycles, static objects, etc.), different sensor systems that detected the objects (e.g., image or LIDAR sensors), and/or different attributes (e.g., positions, sizes, velocities, etc.) of the objects in the environment. In this example, the timing model for a single component in the perception system may include multiple different timing data (e.g., an average time or distribution of times) for any or all of the unique combinations of input data factors (e.g., number of input messages, types of input messages, channels of input messages, sizes or other attributes of input messages, etc.). For an example component in a perception system, a first timing data may be determined when N objects are detected in the environment, M of the objects are pedestrians, and O types of sensors were used to detect the objects, while a second different timing data may be determined for the component when the input data includes a different number of objects, a different number of pedestrians, or different sensors used to detect the objects, and so on.

Additionally, in some examples the timing data (e.g., averages product output times and probability distributions of times) for a component may be determined based on the outputs of the component. For instance, the model generation system may determine the number of messages output by the component during an execution of the component, along with attributes of the output messages such as the destination of the output messages (e.g., an identifier of a downstream component), a channel or topic of the output messages, the size of the output messages, and/or the type of the output messages, and may use this data to generate a timing model with multiple timing values or distributions for the component based on the number/type/attributes of the output messages. Continuing with the above example, the timing model for the component in the perception system may include different timing data (e.g., different average times or distributions of times) based on different output data factors (e.g., number of output messages, types of output messages, channels of outputs messages, sizes or other attributes of output messages, etc.).

In some implementations the model generation system may generate a timing model for a component based on both the inputs provided to the component and the outputs generated by the component during the execution. For instance, a timing model for a component may have first timing data for one set of inputs and one set of outputs, a second timing data for the same set of inputs and different outputs, third timing data for different inputs and the same set of outputs, and so on.

Additionally or alternatively, the model generation system may generate a timing model for a component based on signals received from instrumented software code within the component. For instance, it may be observed that product output time(s) of a component during execution may based on whether a certain code segment in the component is executed, and how many times the code segment is executed during the execution of the component. To determine the code segment execution data, the component may include code instrumentation data and/or specialized instructions embedded into the software to output into a log file data indicating when and how many times a particular code segment, loop, or function is executed. When such data is available identifying when and how often particular code segments, loops, or functions are performed during the execution of the component, the model generation system may use this data to generate a timing model for the component. For instance, the timing model for the component may include different time duration values or distributions for product output times, depending on when and/or how many times a particular code segment was executed during execution of the component.

In the examples discussed above, the model generation system may generate timing models for a component in a data pipeline, to model the timing of the products (e.g., output messages) output by the component during execution, relative to the beginning of the component execution (e.g., an execution initiation time by a controller). As discussed above, a timing model for a component may include product output time values (e.g., averages) and/or product output time distributions for the component. As in the various examples discussed above, the model generation system may generate timing models based on the times at which products were output during the previous executions of the component, the inputs provided to the component for the previous executions, the products output by the component during the previous executions, and/or how often particular code segments were executed during the previous executions of the component. Although these various sources of data for generating and training timing models for components are discussed separately in some examples, it can be understood in the context of this disclosure that the model generation system may use any combination of the data described herein to create and train timing models for product output times of components in a data pipeline.

After a timing model has been generated for a component (or multiple components) in data pipeline, the timing model(s) may be used by controllers when executing the components of the data pipeline. For instance, a simulation system or other computing environment executing components of the data pipeline may use the timing model(s) to control the timing of output messages from components during the simulations. As noted above, by enforcing the timing of the output messages during simulation processes, and modeling the timing data based on log data collected during online operations of the data pipeline in production environments, a simulation system may provide technical advantages by more accurately reproducing the online/production outputs and behaviors of the components, while also providing additional computational efficiencies of executing simulations in dedicated, large-scale computing environments.

When executing one or more component(s) of a data pipeline in a simulation system (or other computing environment), the simulation system may use controllers as described above to initiate the execution of the components, provide input data to the components from upstream components, and provide outputs from the components to downstream components. During the execution of a component, a timing model enforcer component within a controller may use the timing model to determine and enforce the times of the product outputs by the component during the controlled execution. As an example, a controller may use the timing model to determine a time of N milliseconds (N-ms), as measured from the initiation of the component execution, that a product is to be output via a particular channel/topic. During the simulation, although the component may output the product earlier than N-ms from the beginning of the execution, the controller may receive and store the product output by the component until the N-ms time threshold. When the N-ms time threshold is reached, the controller may provide the product output by the component to one or more downstream components in the pipeline via the particular channel/topic. Therefore, such simulation systems and other computing environments may use the timing model to achieve a high level of behavioral similarity, both for individual components of the data pipeline and for interactions between cascading chains of upstream-downstream components, relative to the behavior of the components and the data pipeline when executing in online systems and/or in production environments.

The techniques described herein thus may provide particular advantages of achieving a high level of behavioral similarity when executing components of data pipelines in different computing nodes and/or environments (e.g., different graphics processing unit (GPU) pipelines and/or different GPUs, different central processing unit (CPU) core(s) and/or different CPUs, different machines connected over a network, different virtual machines), which may be necessary in simulation systems and/or various other applications to achieve computational efficiency.

The techniques described herein may also allow independent characterization of one or more components of a data pipeline. This can enable a simulation of the component to act in a more realistic manner. Of note, the components of the pipeline may be non-deterministic and therefore may be difficult to simulate except when specific sets of inputs and corresponding data pipeline configurations are simulated. Using the disclosed techniques, a component of a data pipeline or a data pipeline itself can be simulated and act in a realistic manner regardless of the input provided to the component or data pipeline.

The techniques described herein also may facilitate the ability to replace a component of a data pipeline system with another component in a "plug-and-play" manner when, formerly, a developer would have needed to specify a pipeline flow and/or re-write portions of other components. In some examples, the techniques discussed herein include replacing a component of a data pipeline with an alternate component and comparing behavior of the system before and after the component replacement. For example, systems with data pipelines described herein may reproduce the behavior of the AI stack of an autonomous vehicle using log data, and/or may deterministically simulate the behavior of the AI stack using simulation data, to achieve a first set of outputs from the AI stack and/or components thereof. A data pipeline within a perception system, prediction system, planning system, and/or other systems of the AI stack may be replaced by updated systems, and the AI stack may be run again using the same log data and/or simulation data, allowing behavior/performance of the AI stack to be compared before and after the component replacement. In at least some examples, the data pipeline controllers may enable preserving certain system variables (e.g., internal states, execution times, etc.), despite having differing components. In such examples, the system may be able to categorize how a component impacts overall system accuracy and/or precision, regardless of system resources required.

FIG. 1 is a block diagram illustrating an example computing environment for generating and using timing models to control the execution of components in data pipelines. In this example, the computing environment 100 includes an autonomous vehicle 102 comprising one or more systems implemented using components in a data pipeline. The computing environment 100 also includes a model generation system 104 configured to generate and/or train timing models based on log data received from one or more autonomous vehicle(s) 102, and a simulation system 106 configured to use the timing models to control the timing of the component outputs during a simulation.

According to the techniques discussed herein, the autonomous vehicle 102 may receive sensor data from sensor(s) 108 of the autonomous vehicle 102, and may execute an example system 110 implemented as a data pipeline with multiple components, based on the sensor data. For example, the sensor data may include a location signal (e.g., a GPS signal), an inertia signal (e.g., an accelerometer signal, a gyroscope signal, etc.), a magnetometer signal, a wheel encoder signal, a speedometer signal, a point cloud of accumulated LIDAR and/or RADAR points, an image (or images), an audio signal, bariatric or other environmental signals, etc.

The autonomous vehicle 102 may provide the sensor data received from such sensor(s) 108 to one or more systems to accomplish a variety of functions of the autonomous vehicle. For example, computing environment 100 depicts component executing in a production environment (e.g., the components of the data pipeline are operating in an online system and not in a simulation system or other offline environment). In this instance, the example system 110 may represent a simplified perception system implemented as a data pipeline. The example system 110 may receive, as inputs, sensor data from the sensor(s) 108. Based at least in part on processing the sensor data, the example system 106 may output a product 112, such as bounding box(es) and/or semantic label(s), which may be generated responsive to operation of the example system 110.)

Although the example system 110 in this instance depicts a simplified perception system, in other examples vehicle-based systems implemented using components in a data pipeline may include one or more systems configured to control a passenger ride experience (e.g., temperature/humidity control, interior display control, door control functionality, seat functionality), a localization and/or mapping system configured to generate a map of surroundings of the autonomous vehicle and/or a position and/or orientation of the autonomous vehicle 102 within a map, a perception system configured to detect and track object(s) in an environment of the autonomous vehicle, a prediction system configured to predict future positions, velocities, and/or accelerations of objects in the environment, a planning system configured to determine a trajectory for controlling motion of the autonomous vehicle, etc. Each of these example systems may include one or more components arranged in a data pipeline configuration in which outputs from one or more upstream components are routed to the inputs of one or more downstream components. The component(s) in the example system 110 and/or data pipelines may comprise software and/or hardware components. For example, a component may comprise a machine-learned model such as a neural network and/or other instructions executable by a processor.

According to the configuration of the computing environment 100, the example system 110 may comprise a data pipeline including the components such as a sensor data processor 114 which may receive, normalize, smooth, convert, and/or otherwise preliminarily process the sensor data. In some examples, the sensor data processor 114 may comprise sub-components such as, for example, a Gaussian filter, a digital-analog converter (DAC), a sensor driver, etc. The sensor data processor 114 may transmit output generated by the sensor data processor 114 to one or more downstream components, which, in the depicted example, may comprise a segmentation component 116 and a bounding box component 118. The segmentation component 116 may receive processed sensor data from the sensor data processor 114 (which is an upstream component in relation to the segmentation component 116) and may identify a portion of sensor data as being attributable to an object (e.g., labeling points of a LIDAR point cloud as being associated with an object, identifying pixels of an image, projecting LIDAR points onto an image and identifying projected points and/or pixels as being associated with an object). The segmentation component 116 may output the segmented sensor data to downstream components, which, in the depicted example, may comprise the bounding box component 118 and the semantic classification component 120.

The bounding box component 118 may receive inputs from upstream components, sensor data processor 114 and segmentation component 116. The bounding box component 118 may generate bounding box(es) for one or more objects that are reflected in the processed sensor data and that correspond to the segmented sensor data received from the segmentation component. The bounding box may transmit the generated bounding box(es) to downstream component(s), which may comprise an object identification component 122.

The semantic classification component 120 may generate a semantic label for a portion of sensor data that has been segmented, based at least in part on the segmented sensor data received from the segmentation component 116. For example, the semantic label may include any semantic label that one or more machine-learned models of the semantic classification component 120 are configured to output upon evaluation (e.g., "pedestrian," "two-wheeled vehicle," "bicyclist," "parked vehicle").

The object identification component 122 may amalgamate a variety of inputs received from upstream components, including the bounding box(es) output by the bounding box component 118 and/or the semantic labels of the semantic classification component 120 to output product 112 to one or more downstream components. For example, the product 112 may comprise an object identifier, formatted as a programming object usable by a planning system to generate a trajectory to control motion of the autonomous vehicle 102 and/or usable by a GUI component to generate a representation of the sensor data, the bounding box(es), and/or the semantic label.

It is contemplated that a perception system implemented as a data pipeline may, in some examples, include many more components and/or may conduct many more functions. For example, a perception system may include multiple components to detect objects from sensor data, multiple components to determine a classification of the objects, multiple components to determine a current and/or future heading, position, velocity, and/or acceleration of an object, multiple components to track object(s), multiple components to generate a map of the environment, multiple components to localize object(s) within the map, multiple components to determine a bounding box for an object, etc. For example, the segmentation component 116, by itself, may comprise multiple sub-components such as, for example, multiple machine-learned models, processor-executable instructions, and/or hardware (e.g., an FPGA and/or an ASIC).

The example system 110 is illustrated and explained above merely to give one skilled in the art context for what is meant by a "system," a "component," and/or sub-components.

The model generation system 104 may be configured to generate and/or train timing models associated with components in data pipelines. In various implementations, the model generation system 104 may receive log data 124 from one or more autonomous vehicles 102 operating in real or simulated environments, and may execute a timing model generator component 126 configured to analyze the log data 124 and determine timing model(s) 128 based on the log data 124. The timing model generator component 126 may use any combination of the techniques described herein to determine timing data representing product output times associated with the components of the example system 110. In some instances, the timing model generator component 126 may use statistical analyses to generate one or more timing models 128 for the components 114-122, where the timing models 128 may include statistics-based timing data such as averages of the product output time(s) for different components 114-122 via different channels, and/or probability distributions of product output times for different components 114-122 via different channels. Additionally or alternatively, the timing model generator component 126 may use machine-learning techniques and/or regression analyses to generate timing models 128 based on the input data provided to the components 114-122 (e.g., the number of input messages, types of input messages, channels of input messages, sizes or other attributes of input messages, etc.), the product data output by the components 114-122 and/or example system 110 (e.g., number of output messages, types of output messages, channels of outputs messages, sizes or other attributes of output messages, etc.), and/or data indicating how often particular code segments within the components 114-122 were executed during the previous executions of those components 114-122.

As depicted in FIG. 1, the model generation system 104 may provide one or more timing models 128 to the simulation system 106. The simulation system 106 may include controller(s) 130, described below in more detail, which are configured to control the execution of the example system 110 (and/or a subset of the system components 114-122) based on the timing models. For instance, the simulation system 106 may use the timing models to determine timing data for the components 114-122, including predicted and/or modeled product output times based on particular components, channels, and/or other factors. The simulation system 106 may enforce the timing data determined based on the timing models 128, thereby providing a higher level of behavioral similarity for the outputs and behaviors of the example system 110 executing in the simulation system 106, with respect to the same example system 110 executing in a native or production environment such as the autonomous vehicle 102.

Figure 2A:
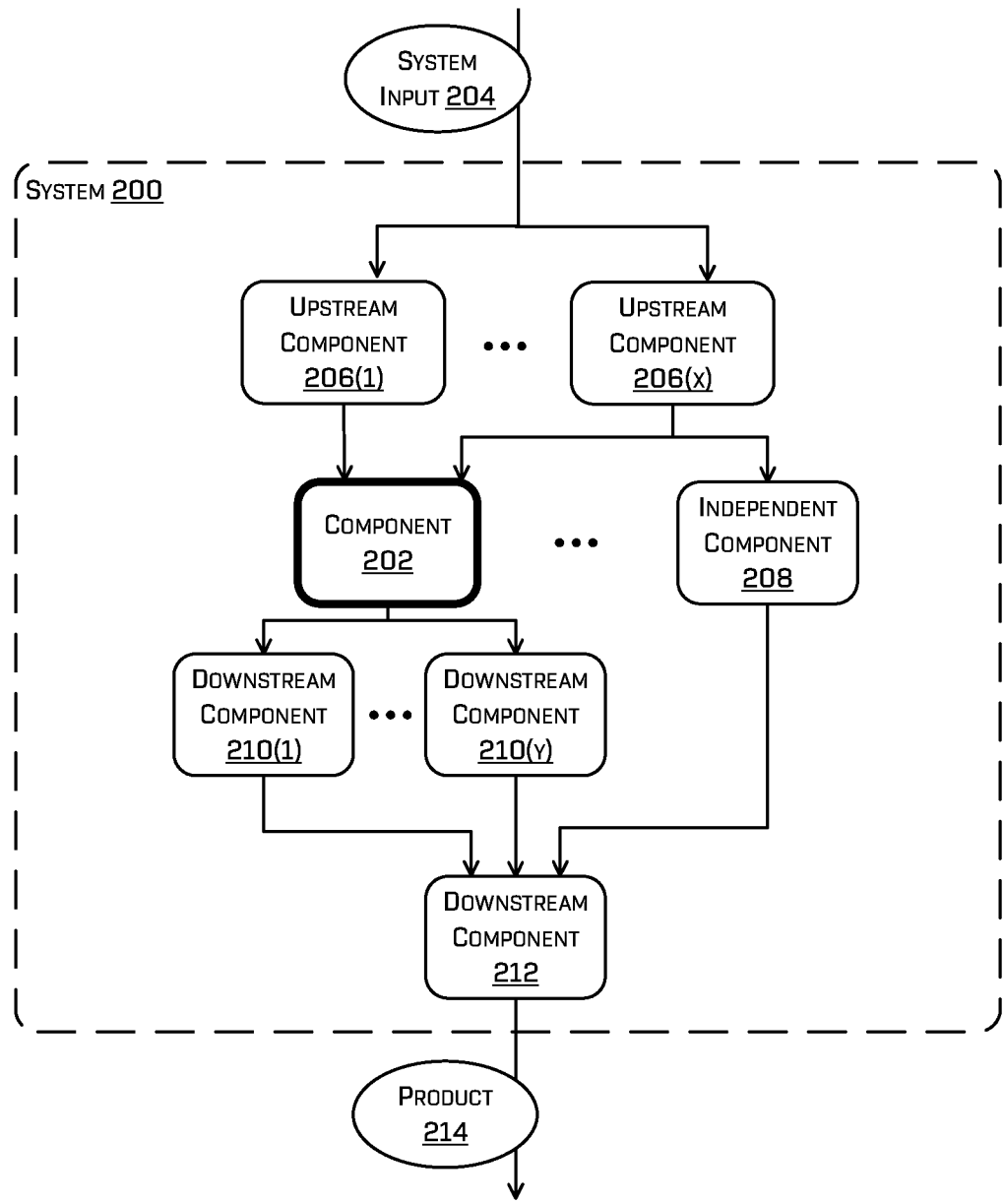
FIG. 2A illustrates a block diagram of an example system comprising one or more components of a data pipeline, in accordance with implementations of the disclosure.
Figure 2B:
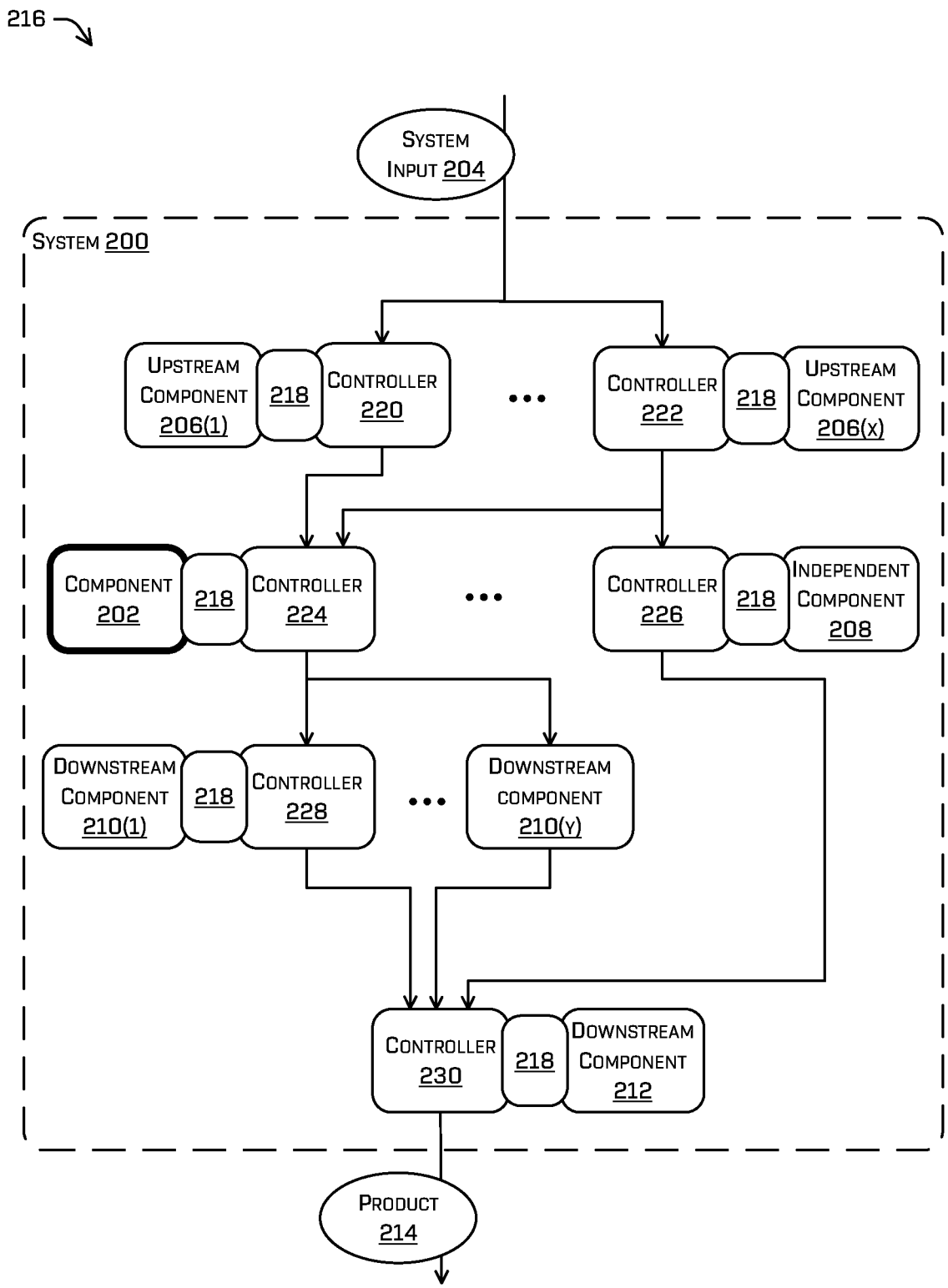
FIG. 2B illustrates a block diagram of an example system for controlling input to, output from, and/or execution states of one or more components of a data pipeline, in accordance with implementations of the disclosure.

FIG. 2A illustrates a block diagram of an example system 200 comprising one or more components configured to operate within a data processing pipeline. FIGS. 2A and 2B are described below from the perspective of component 202, which is emphasized with a bolded line. In some examples, the system 200 may be configured as a data pipeline including a number of interconnected components configured to execute in a production environment. The system 200 may receive system input 204, which in some cases (e.g., autonomous vehicle systems) may comprise sensor data, a product of another system, etc. The system input 204 may be processed by upstream component(s) 206(1)-(x). In some instances, component 202 may subscribe to output(s) of one or more of upstream component(s) 206(1)-(x) and/or otherwise receive output(s) of one or more of the upstream component(s) 206(1)-(x). Although FIG. 2B illustrates both component 206(1) and 206(x) as providing outputs to component 202, not every component in the first layer may necessarily provide output to the component 202. A first component may be "upstream" from a second component by providing output of the first component to the second component as input to the second component. Therefore, a component that receives the system input 204 and does not provide that component's output to component 202 may not be considered an "upstream" component from the perspective of component 202. For example, from the perspective of independent component 208, upstream component 206(1) is not an upstream component to independent component 208 since the independent component 208 does not receive, as input to the independent component 208, an output generated by upstream component 206(1).

The independent component 208 is independent from the component 202 in that the output of independent component 208 does not affect output of component 202, whereas the operation of component 202 is based at least in part on the product(s) of at least upstream components 206(1) and 206(x).

Based at least in part on receiving, as input, product(s) from upstream components 206(1) and/or 206(x), component 202 may execute and, responsive to executing, may generate an output. The component 202 may provide this output to downstream component(s) 210(1)-(v), e.g., by publishing the output via a topic and/or channel to which the downstream component(s) 210(1)-(y) subscribe. As noted above, downstream component(s) 210(1)-(y) may receive, as input, the output of component 202 and may execute based at least in part on the output of component 202, generating respective output(s), which downstream component(s) 210(1)-(v) may transmit to subsequent downstream component 212 and so on. In some instances, downstream component 212 may exist in a last layer of the system 200, such that output from downstream component 212 is a product 214 of the system 200. For example, if system 200 corresponds to a planning system of an autonomous vehicle, the product 214 may include a trajectory (e.g., a speed, steering angle, and/or steering angle rate). As another example, if system 200 corresponds to a perception system of an autonomous vehicle, the product 214 may include an object list comprising a position, velocity, acceleration, and/or a classification of a detected object, and so on.

FIG. 2B illustrates a block diagram of an example framework 216 for controlling input to, output from, and/or execution states of one or more components of the system 200 implementing the data pipeline. In some instances, to implement the framework, an I/O interface 218 (termed "I/O 218" in FIG. 2B for brevity) may be included in the component(s) for which timing models may be generated and used. In some instances, implementing the example framework 216 may comprise associating a controller (220-230) with each component that is to be controlled via the example framework 216. In some instances, a controller may be assigned to each component of system 200 that comprises the I/O interface 218 at a 1:1 ratio, although other arrangements are contemplated (e.g., one controller that is associated with three components, one controller that is associated with components in one layer of the pipeline, one controller that is associated with components of a specified type in the system 200).

Instead of allowing components to receive input(s), execute, and/or provide output(s) to other components at any time, the controllers 220-230 may control these and other functions. The controllers 220-230 may comprise controllers of different types, and the controllers 220-230 may control the input(s) to a component with which a respective controller is associated, an execution state of the component, and/or the output(s) from that component to subscribing (downstream) component(s). In some examples, a component that is controlled by a controller (e.g., component 202 is controlled by controller 224) may be isolated from the other components and the controller associated therewith may provide the inputs to and outputs from the component, as prescribed by the data pipeline.

In this example, certain components that do not include an I/O interface 218, such as downstream component 210(y), may receive input, execute, and/or transmit output independently rather than based on a controller. Components without I/O interfaces and/or associated controllers may be referred to herein as an "uncoordinated components." In some instances, a special type of controller, a coordinating controller, may ensure that outputs from a coordinated controller are properly received by an uncoordinated controller (e.g., this may comprise determining a time at which to provide an input to the uncoordinated controller, converting a message type to a message type usable by the uncoordinated controller). Subsequent figures explain in more detail interactions of a controller with an I/O interface 218 and/or the component with which the controller is associated.

In some instances, the controllers 220-230 may receive data from and/or transmit data to other one(s) of the controllers 220-230 via one or more middleware(s) and/or network topologies. For example, component 202 may be associated with a first process executed on first hardware. Controller 224 may receive and/or transmit data via different types of middleware to the various other controllers in the framework. In other words, the controller 220-230 may be configured to receive and/or transmit data to other controllers associated with different computing context(s) and/or over different middleware(s)/different implementations of inter-process communication (IPC). For example, during online operation, a controller may receive a message via an operating system's IPC, but during a simulation or other reproduction of an online scenario, as discussed below; the controller may read the message from a computer-readable media (e.g., this may comprise decoding a video file and/or replaying one frame of the video frame at a time).

FIGS. 3-6 illustrate block diagrams of a component 300, I/O interface 302, and various types of controllers and respective components and functions of the various types of controllers. In some examples, the component 300 may comprise instructions 304. Instructions 304 are depicted as including a neural network 306, although the instructions 304 may additionally or alternatively include processor-executable instructions. Although not depicted for simplicity, component 300 may additionally or alternatively comprise hardware such as, for example, a DAC, ASIC, FPGA, etc.

In some examples, the I/O interface 302 may comprise an initialization input interface 308, an execution input interface 310, and an output interface 312. The initialization input interface 308 may receive one or more variables from a controller and provides them, as input data, to the instructions 304 so that execution of the instructions 304 may be based at least in part on the one or more variables. In some instances, the initialization input interface 308 may be configured to set an initial state of the component 300 and/or instructions 304 and/or provide initial variable(s) to the instructions 304, and in additional or alternate examples, the initialization input interface 308 may receive variable(s) 328 from a controller and may provide them as input to the instructions 304 at any point during the execution of the instructions 304 (e.g., before execution, during execution, based at least in part on receiving a request for a variable from the instructions 304).

The execution input interface 310 may receive an instruction to execute from a controller and, in response, may cause the component 300 to execute. Additionally, when the instruction is not received, the execution input interface 310 may delay or otherwise prevent the component 300 from executing. The output interface 312 may receive one or more products of an execution of the instructions 304 and may provide the products to a controller. In some examples the I/O interface 302 may include additional components to serialize and/or deserialize the internal state of the component 300, in which particular internal states may be saved for later loading into the component 300 when desired to accurately reproduce a behavior or initial state of the component during an execution.

Figure 3:
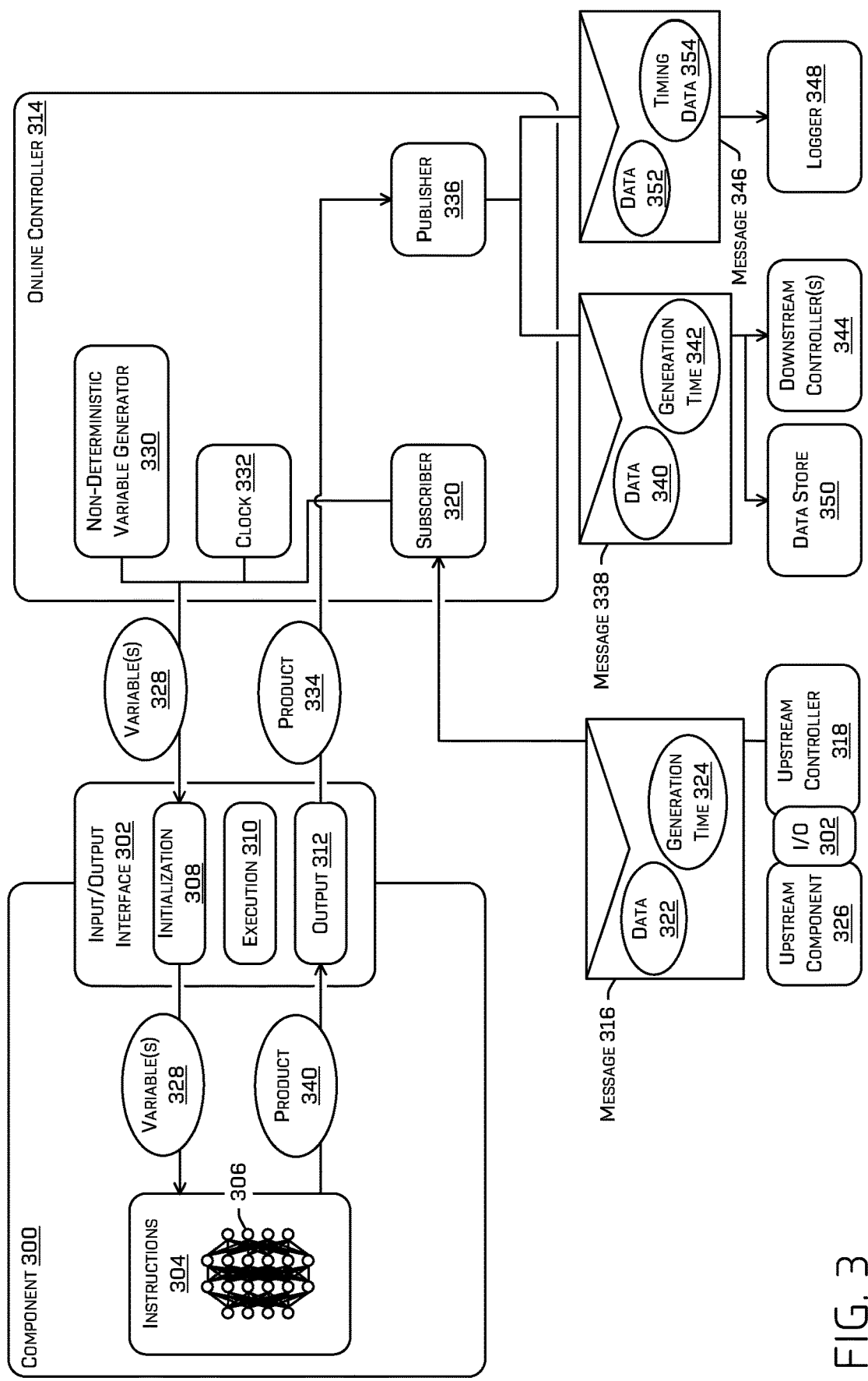
FIG. 3 illustrates a block diagram of a data pipeline execution system including a component, I/O interface, and an online controller, in accordance with implementations of the disclosure.

FIG. 3 illustrates a block diagram of the component 300, I/O interface 302, and an online controller 314. The online controller 314 may refer to a controller operating during real-time execution of a system in a production environment. For example, online controller 314 may be used on an autonomous vehicle to provide messages from upstream controller(s) to the component 300, from the component 300 to downstream controller(s), thereby abstracting the input/output functionalities of the component 300, and/or to control when the component 300 executes. The online controller 314 may also be considered a baseline controller, as other controller type(s) may include one or more of the components and/or functions of the online controller 314.

In some examples, the online controller 314 may receive a message 316 from an upstream controller 318 at a subscriber 320 of the online controller 314. According to the examples discussed herein, the framework may comprise a publish-subscribe architecture between controllers so that controllers do not need to specifically address another controller and so that a pipeline flow can easily be modified by directing the subscriber 320 of a controller to remove and/or add a subscription to a channel and/or topic. For the sake of clarity, this is the only architecture discussed herein for relaying an output from a component to another controller, although it is understood that any other suitable transmission protocol may be implemented.

Regardless, subscriber 320 may receive the message 316 and determine that message 316 comprises data 322 and/or generation time 324. The generation time may comprise an identifier of a time at which a product (e.g., associated with data 322) was received at the upstream controller 318 from the upstream component 326 associated therewith, a time at which the upstream controller 318 generated the message 316, a monotonically increasing value that uniquely identifies the upstream component 326 and a particular execution that resulted in message 316, and/or a time at which the upstream controller 318 published the message 316. In some instances, data 322 may comprise a product of an execution of upstream component 326 associated with upstream controller 318.

Subscriber 320 may provide data 322, or at least a portion thereof, to the initialization input interface 308 as one of one or more variable(s) 328 provided from the online controller 314 to the initialization input interface 308. Variable(s) 328 may include values usable by instructions 304 to execute. For example, the instructions 304 may comprise a process configured to receive a Gaussian random number distribution, a LIDAR point cloud, and a covariance matrix and a neural network that is configured to receive the LIDAR point cloud and a semantic label. The online controller 314 may generate a non-deterministic variable value at a non-deterministic variable generator 330. For example, this may comprise generating a random number distribution, etc. In other words, instead of allowing the component 300 to generate a value that could not be deterministically reproduced, the non-deterministic variable generator 330 may generate the value. Moreover, a clock 332 may additionally or alternatively provide a clock signal to the initialization input interface 308 as one of the variable(s) 328.

When a component 300 is controlled by an online controller 314, in some instances, the online controller 314 may control when and/or how long the component 300 operates. For example, the online controller 314 may perform a callback via the execution interface 310, e.g., by providing executable code to the component 300 that may cause the component 300 to execute based at least in part on the executable code provided to the component 300 and/or may comprise variable(s) 328, in some examples. In some examples, the callback may be a synchronous callback, but it is contemplated that the callback may be asynchronous, so long as the online controller 314 controls when the component 300 executes. In additional or alternate examples, the online controller 314 may set the execution input interface 310 to a "high" value, thereby allowing the component 300 to execute once it receives, via the initialization input interface 318, the variable(s) 328. In some examples, the execution input interface 310 may comprise a flag in a register where the online controller 314 may set the flag to a "high" flag value indicating that the component 300 may execute and/or that causes the component 300 to execute based at least in part on the variable(s) 328 received via the initialization input interface 308. Contrarily, a "low" flag value may pause and/or prevent the component 300 from executing until the flag transitions to a "high" value. In an additional or alternate example, the online controller 314 may push an address associated with the instructions 304 onto a stack to cause the component 300 to execute and/or the online controller 314 may call or otherwise notify the execution input interface 310, which, in response, may push the address onto the stack. Once on the stack, one or more processors may execute instructions associated with address upon reaching the address in the stack. In the latter example, the component 300 may transmit the address (and/or any other pertinent addresses if the component 300 comprises multiple sub-components) to the execution input interface 310 in preparation for the execution input interface 310 to push the address onto the stack for execution by one or more processors.

In an additional or alternate example, where an online controller 314 is associated with the component 300, the online controller 314 may cause the component 300 to execute periodically (e.g., at 30 MHZ, at 500 MHZ, at 1 GHZ) and/or when the subscriber 320 determines that message(s) have been received from all the upstream controller(s) to which the online controller 314 subscribes since the last execution of the component 300.

The output interface 312 may receive a product 334 of execution of the component 300 and provide the product 334 to a publisher 336 of the online controller 314. Based at least in part on receiving the product 334, the publisher 336 may generate a message 338 comprising data 340 (e.g., which may include the product 334 and/or a representation thereof) and/or a generation time 342. The publisher 336 may also include appropriate routing information with the message 338 such as, for example, a channel identifier and/or a topic identifier for a pub-sub architecture. The publisher 336 may publish the message 338 and the message 338 may be received by subscribing (downstream) controller(s) 344. It is understood that, although this application predominantly discusses use of a pub-sub architecture to transmit an output of one component to an input of another component, other network configurations are contemplated, and/or otherwise establish the pipeline configuration. Other network configurations may include, for example, allocating a static IP addresses to a controller and/or uncoordinated component, addressing controller(s) and/or uncoordinated components using a virtual routing and forwarding (VRF) scheme, etc.

In some instances, the publisher 336 may publish a timing model message 346 in addition to message 338 (or instead of message 338 if the component 300 is a sink, i.e., the component 300 digests an input but does not send an output to another controller/component). In some instances, the timing model message 346 may be received by a logger 348 that receives timing model message(s) from one or more components over a logging channel that is different than a channel for data messages (a "data channel"). Messages 316 and 338 may be examples of data messages. In some instances, a data store 350) may "listen" to the data channel, thereby receiving one or more data message(s), such as message 316 and/or message 338.

In some instances, timing model message 346 may comprise various component execution data 352 and/or associated timing data 354. In some instances, the component execution data 352 may comprise information sufficient to reproduce a particular operation of the component 300 (e.g., input data, internal state data, execution times, etc.) and/or may provide an indication of order of operation (e.g., execution) of components.

Figure 4:
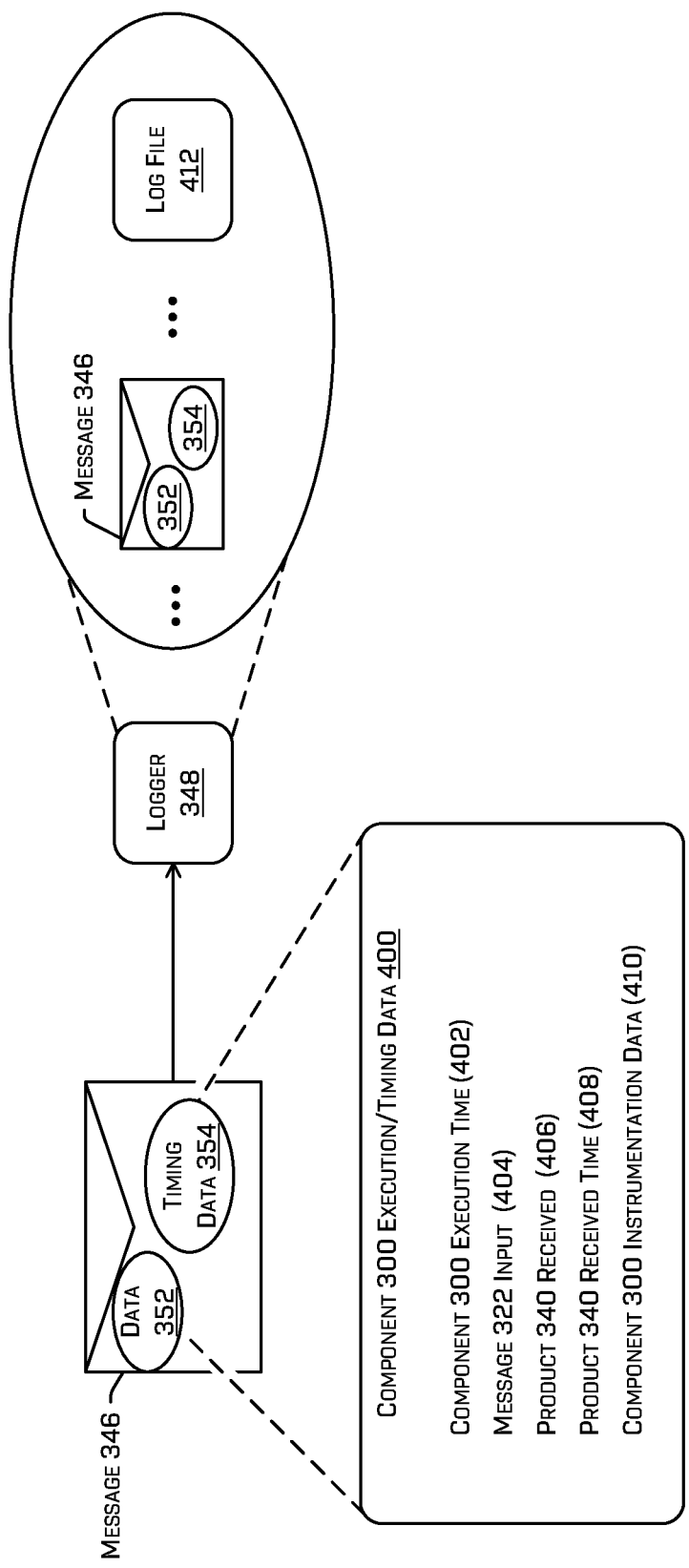
FIG. 4 illustrates a block diagram of an example architecture for implementing a logger for collecting execution data and timing data associated with a component, in accordance with implementations of the disclosure.

FIG. 4 illustrates a block diagram of an example architecture including a logger 348 configured to receive and store timing data associated with component executions in a data pipeline. In some examples, logger 348 may receive timing model messages, such as timing model message 346, over a logging channel. As discussed above, a data message, such as message 338, may include a generation time 342 and data 340 comprising a product 334 of an execution of the component 300. In some instances, the generation time 342 may comprise a monotonically increasing value that uniquely identifies the component that generated the message and/or a particular execution of the component that resulted in the message 338.

In some instances, a timing model message, such as timing model message 346, may include the same identifier as the message 338 corresponding therewith and/or may otherwise be identified as being associated with message 338. In some instances, the execution data 352 and/or timing data 354 in the timing model message 346 may include information sufficient to deterministically reproduce behavior of the component 300. For example, execution data 352 may comprise a sequence of events, non-deterministic values generated by the non-deterministic variable generator 330 and/or provided as input to the component by the controller, diagnostic information regarding execution of the component (e.g., an execution duration of time, a number of core(s) and/or threads devoted to executing the component, a status of execution of the component (e.g., success, failed, paused)), and/or a keyframe received from the component. In such examples, the timing data 354 within the timing model message 346 may include times associated with any of the events represented in the execution data 352.

As a non-limiting example, the execution data 352 and/or timing data 354 in a timing model message 346 may include execution and timing data 400 including at least a time at which the component 300 was executed (e.g., a time at which the online controller 314 initiated the execution), input data 404 corresponding to one or more messages 316 provided as input to the component 300, output data 406 corresponding to one or more products 334 received by the online controller 314 from the component 300 based on the execution, timing data associated with the output data 406 received from the component execution, and instrumentation data 410 indicating how many times various code segments executed during the execution of the component 300. In some examples, the execution and timing data 400 shown in this example may be collected and stored by the logger 348 for a sequence of multiple events occurring at the component 300 (and/or I/O interface 302 and/or online controller 314) and/or an order in which events occur at the component 300 relative to event(s) at another component.

In this example, the execution and timing data 400 may depicts events such as messages input to the component 300, starting the execution of the component 300, receiving products from the component 300, publishing messages, and all times associated with these events. However, in other examples, it is contemplated that any of the I/O interface 302 and/or online controller 314 operations discussed herein may be recorded by the execution and timing data 400. For example, variable(s) 328, product 334, any non-deterministic variable values provided to the component 300, clock data, etc., and the times associated with this data, may be stored in the execution and timing data 400.

In some instances, logger 348 may store timing model message(s) received at the logger 348. Each timing model message stored by the logger 348 may comprise time data associated with various events, non-deterministic variable values, clock data generated by a clock of a controller (e.g., a duration until, a delay between, and/or a time at which various events occurred), and/or keyframe(s) associated with an execution of the component(s) associated therewith. In some cases, the logger 348 may generate a log file 412 based at least in part on the timing model message(s) received at the logger 348. The log file 412 may comprise a total sequence of events and associated timing data generated from the respective sequences of events and timing data indicated by the timing model message(s) received at the logger 348 for a particular component. In some instances, the logger 348 may generate a log file for each component of a system, so that each component has a sequence of events and timing data associated therewith that identifies an order and/or associated message(s) (and/or other non-deterministic data such as non-deterministic variable value(s), clock data, keyframes, etc.). In an additional or alternate example, the logger 348 may generate a total sequence of events and timing data that reflects an order of events at two or more components, based at least in part on sequences received from controllers associated with the two or more components. In other words, the log file 412 may comprise a sequence events that reflects timing of events at two or more components of a system, up to all of the components of a system, so that the events are ordered with respect to all the components. In some instances, logger 348 may be implemented as part of online controller 314.

Figure 5:
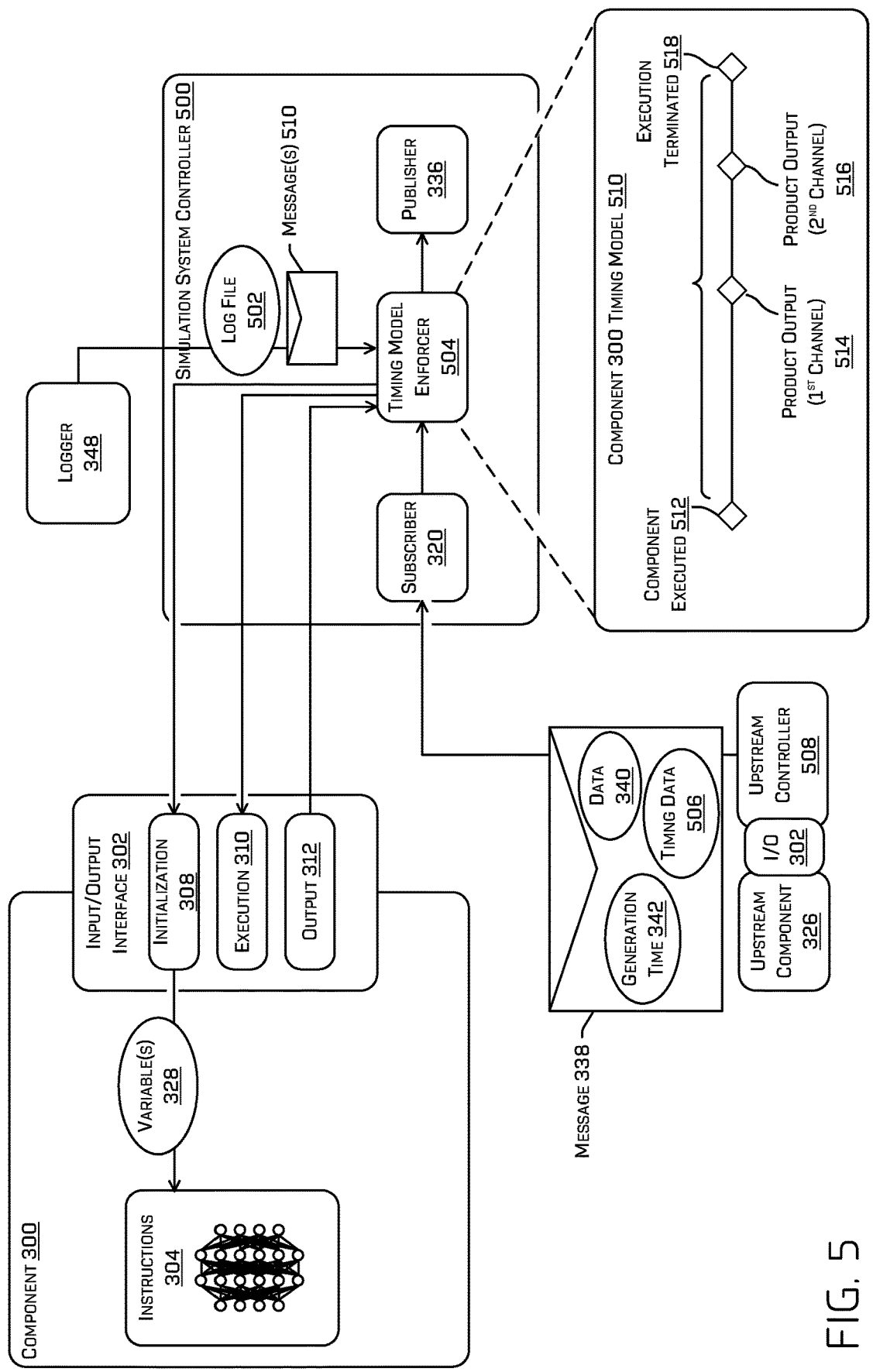
FIG. 5 illustrates a block diagram of a data pipeline execution system comprising a component, I/O interface, and a simulation system controller, in accordance with implementations of the disclosure.

FIG. 5 illustrates a block diagram of the component 300, I/O interface 302, and a simulation system controller 500. FIG. 5 repeats an input phase depicted in FIG. 3 and elaborates on additional or alternative functions and/or components that may be included in a simulation system controller 500. FIG. 5 continues the discussion of the simulation system controller 500 regarding the execution and/or output phase of FIG. 3. As noted above, the simulation system controller 500 may be configured to execute and capture the behavior of the component 300 in such a way that behavior of the component 300 is a similar as possible to the manner in which the component 300 behaves in systems with online controllers 314 in production environments. FIG. 5 illustrates a block diagram of the component 300, I/O interface 302, and a simulation system controller 500. In some instances, the simulation system controller may comprise one or more of the components and/or functionalities of the online controller 314 and may additionally or alternatively reproduce previous events at a component deterministically and portably. For instance, the simulation system controller 500 may receive a log file 502, which may represent log file 412 and/or other log files. For example, online controller 314 (and/or a logger 348 associated therewith) may generate the log file 502 and save and/or transmit it to a memory accessible by the simulation system controller 500.

In some examples, simulation system controller 500 may comprise a timing model enforcer 504 that applies the timing model(s) generated for the component 300 when the component 300 is executed by the simulation system controller 500, so that operations performed on the simulation system that include executing component 300 may perform behaviorally similar to similar operations performed on online systems in production environments. As discussed above, the timing model enforcer 504 and timing model(s) may allow executions of the component 300 to be reproduced deterministically, potentially in non-real time in some instances (e.g., operating more quickly or slowly than online hardware may operate, operating on different kinds of hardware with different computing resource capabilities and/or functionalities). Along with the timing model enforcer 504, the simulation system controller 500 may use a global clock to synchronize executions of the components of the system, and ensure that each component has the inputs it uses to execute/that each component doesn't receive an input it should have received for an execution after the execution occurs.

Although this example relates to simulation system controller 500, in other examples the simulation system controller 500 may comprise any controller using timing model(s) and timing model enforcer 504 to control the timing of the products output by the execution of the component 300. In various examples, the systems executing the online controller 314 and the simulation system controller 500 (or other offline system controller) may be configured to operate on different types of software and/or the framework may distribute processing of the system over nodes of a distributed computing system that may comprise hardware of different capabilities and therefore operating speeds and/or functionalities. For example, one component may comprise a sub-component process that that runs on a central processing unit (CPU) whereas a second component may comprise thousands of sub-component threads executable by graphics processing unit (GPU) cores/pipeline(s). Not only will sub-components differ in complexity and run-time, but the CPU and GPU may include different computing resource management functionalities that exhibit different behaviors when computing resources aren't available to process a sub-component. For example, a CPU may include process management such as an advanced scheduler and/or hyperthreading which may block a process from executing until the computing resources become available, but the GPU may include a more rudimentary system that may cause a thread to fail if computing resources aren't available. Because of this, the system may not be reproduced accurately if the native process management functions of the CPU, GPU, and/or other processor(s) control scheduling of the component(s).

In certain examples, timing model enforcer 504 and/or timing model 510 may enforce a distribution of timing data (e.g., Gaussian, Bayesian, etc.) that may be determined based on a log file 502, for example, or other log data including message(s) from a component, such as component 300, and corresponding timing data. Variations in the timing data can be analyzed over time to determine a matching distribution that may be used to model the component. For example, it may be determined that messages from a specific component are output at certain time(s) with a Gaussian distribution of variance. If so, a corresponding simulated component can be determined to output the messages using the same Gaussian distribution. It should be understood that the output timing information and/or distribution information can be modified or otherwise depend on a corresponding state of a component that can be modeled via one or more parameters. Parameters may include a hardware version of the component (which may indicate available hardware resources), an operational state of the component (e.g., if the component is degraded by wear or extreme temperature, if the component is operating in a certain high power or low power mode, etc.), a temperature of the component, an available hardware resources (e.g., a processor idle state or usage state), a volume of ancillary messages received by the component, a type of message(s) received by the component (e.g., a pedestrian vs a vehicle sensor object), or any combination of the preceding.

In some examples, the simulated component's output can be modeled by a machine-learned model that may use any of the aforementioned parameters as input features. The machine-learned model may be trained based on log data that may include corresponding values for the parameters. For instance, a model generation system 104 may include a model training system configured to train machine-learned timing models (e.g., timing model 510) associated with individual components, based on any combination of the aforementioned input features which may be used as model training data. For instance, the training data for a machine-learned timing model for a component 300 may include log data representing the output messages produced by the component 300 during execution, such as the number of the output messages, the times the output messages were produced, the communication channels at which the output messages were output, the sizes/types of the output messages, etc. Additional training data for a machine-learned timing model for a component 300 may include various additional data determined from the log data that represents the hardware environment associated with the logged execution of the component 300 (e.g., the autonomous vehicle model type, the types of sensors used, age and degradation of the sensors and other hardware components, the number and types of processors and memory resources, etc.), and the operating environment associated with the logged execution of the component 300 (e.g., the operating system used, software builds/versions used, available computing and memory resources at the time of the logged execution of the component, the other processes executing when the component was executed, the time of day, the vehicle/system temperature, the weather and/or driving conditions, etc.).

Based on the training data, the model generation system 104 may generate and train a machine-learned timing model specific to the component 300, configured to receive as inputs any of the aforementioned parameters/features, and which is configured output timing data for the output messages from the component 300. As noted above, the timing data output by a machine-learned timing model may include predicted and/or modeled values representing the number of output messages produced by the component 300 following an executing of the component 300, the average time duration (e.g., following the initiation of the execution of the component 300) and/or a distribution of time durations associated with each output message from the component 300, and/or other output message characteristics such as the communication channel, the size or type of the output message, etc. In some implementations, the outputs of a machine-learned timing model may include predicted values associated with an output message (e.g., a predicted output message time, predicted output message channel, predicted output message type/size, etc.). Additionally or alternatively, the outputs of the machine-learned timing model (e.g., timing model 510) may include predicted averages and/or distributions associated with the output message characteristics (e.g., predicted output message time averages/distributions, predicted distributions of output channels, predicted averages or distributions of output types/sizes, etc.). The timing model enforcer 504 may use such machine-learned timing models (e.g., timing model 510) to determine the averages and/or sample the distributions of the timing and characteristics associated with the predicted output messages from a component 300.

The framework discussed herein, including the timing model enforcer 504, may allow a component to be out of sync with respect to time as recorded by another controller, but may control the timing of input to, output from, and/or execution of a component so that operation of the system as a whole remains deterministic, components receiving the inputs they use before they execute. The framework may reproduce events at the components in a same order as occurred at a time the events were recorded, even when components do not keep a common time. In some instances, the controller(s) of the framework may comprise separate clocks for each of the components, which are allowed to be and/or become out of sync.

To overcome the issues discussed above that may result from non-simultaneous/non-synchronous execution of the components, messages transmitted between simulation system controllers (or other offline controllers) may further comprise timing data based on a timing model for the component, sufficient to synchronize controllers for component execution in different computing environments. For example, upstream controller 508 may comprise another offline controller, the publisher of which generates and publishes message 338 to include data 340, generation time 342, and/or timing data 506.

In some examples, messages including input data from upstream components also may include timing data, such as timing data 506 associated with message 338. In such examples, the timing data may identify the times at which the input data in the message (e.g., data 340 in message 338) is to be provided to the component 300. For instance, after the simulation system controller 500 receives the timing data 506, the timing model enforcer 504 may use the timing data 506 to determine when to provide the input data 340 to the component 300 via the initialization input interface 308. In other examples, messages contained data received from upstream components, such as message 338 need not include timing data 506 to enforce the times at which the input data is provided to the component 300. For instance, the upstream controller 508 may include a timing model enforcer similar or identical to the timing model enforcer 504, which may cause the messages from the upstream component 326 to be provided to downstream components such as component 300 at the appropriate times based on a separate timing model associated with the upstream component 526. Thus, in various implementations the timing model enforcer 504 may enforce the times at which input data is provided to the component 300 via the initialization input interface 308, and/or times at which the products output via the output interface 312 are transmitted to downstream components.

Timing model 510 may be similar or identical to any of the various types of timing models described herein, and may include various timing data identifying the times relative to an execution of the component 300 at which products output by the component 300 are to be provided to downstream components in the data pipeline. As noted above, in some instances a timing model 510 also may timing data identifying the times relative to a component execution that input data received from upstream components are to be provided to the component 300 in advance of or during an execution of component 300. In this example, the timing model 510 for the component 300 defines a component execution time 512, a first modeled output time 514 corresponding to a time duration starting with the component execution time at which a product output via a first channel is to be provided to downstream components, a second modeled output time 516 corresponding to a time duration starting with the component execution time at which a second product output via a second channel is to be provided to downstream components, and a termination time 518 for the component 300.

In some examples, the various timing data within timing model 510 may be adjusted to account for a delay in delivery of the message 338 to component 300 and/or simulation system controller 500. In some examples, a timing model may define an earliest time at which the component will execute and/or the earliest time at which a next message will be published by the controller responsive to execution of the component. In such cases, the timing data may be a lower bound, meaning the actual publication time may be later than the timing data. In some examples, the simulation system controller 500 may publish, by publisher 336, one or more output messages comprising products of execution of the component 300, and associated generation times identifying an estimated earliest time that the publisher 336 will publish the next message responsive to execution of the component 300.

In some instances, the timing model enforcer 504 may cause execution of the component 300 (e.g. via execution input interface 310) based at least in part on receiving a message (i.e., a message-based execution) and/or determining that a time period has passed (i.e., a time-based execution) since the previous time-based execution. An execution of the component may be defined by a time the execution occurs (whether it is a message-based execution and/or a time-based execution), the component's internal state immediately prior to the execution, and a set of messages that are provided, via the initialization input interface 308, to the component 300 during/at the time of execution. In some instances, a message-based execution may be based at least in part on receiving one or more messages from subscriber(s) that trigger a next execution of the component 300. For example, the timing model enforcer 504 may determine that the component 300 may be configured to receive a first set of messages from a first and second publishing controller and a second set of messages from a third publishing controller, where the component 300 may use either or both sets to execute. The component 300 may output an indication of the set of messages via the initialization input interface 308. In an additional or alternate example, the timing model enforcer 504 may thereby "expect" reception of one or more message(s) to fulfill a set of messages usable by the component 300 to execute. Accordingly, the timing model enforcer 504 may cause the component 300 to execute upon determining that the subscriber 320 has received all of the message(s) to fulfill the first set and/or the second set. The timing model enforcer 504 may also cause the message(s) fulfilling the first set and/or second set to be provided to the component 300 via the initialization input interface 308. In some instances, a set may comprise a single message from a single publisher, although it is contemplated that a set may comprise multiple messages from a single publisher and/or multiple publishers.

In some examples, the timing model enforcer 504 may additionally or alternatively determine the next time at which to cause the component to execute based at least in part on determining a minimum time of a time of the next time-based execution or the lesser of a horizon time and a next message publish time). This may be represented as: (next execution time)=min ((next timing-based execution) U (min ((horizon time, next message publish time): for each publisher that triggers an execution))).

In some instances, the timing model enforcer 504 may additionally or alternatively determine a duration of time for which the timing model enforcer 504 may cause and/or allow the component 300 to execute. For example, timing model enforcer 504 may cause the component 300 to execute one or more times until expiration of the duration of time, such as the duration between an execution time 512 and a termination time 518. In some instances, the timing model enforcer 504 may determine that the duration of time based on the generation data and/or timing data received in input messages from upstream components.

Figure 6:
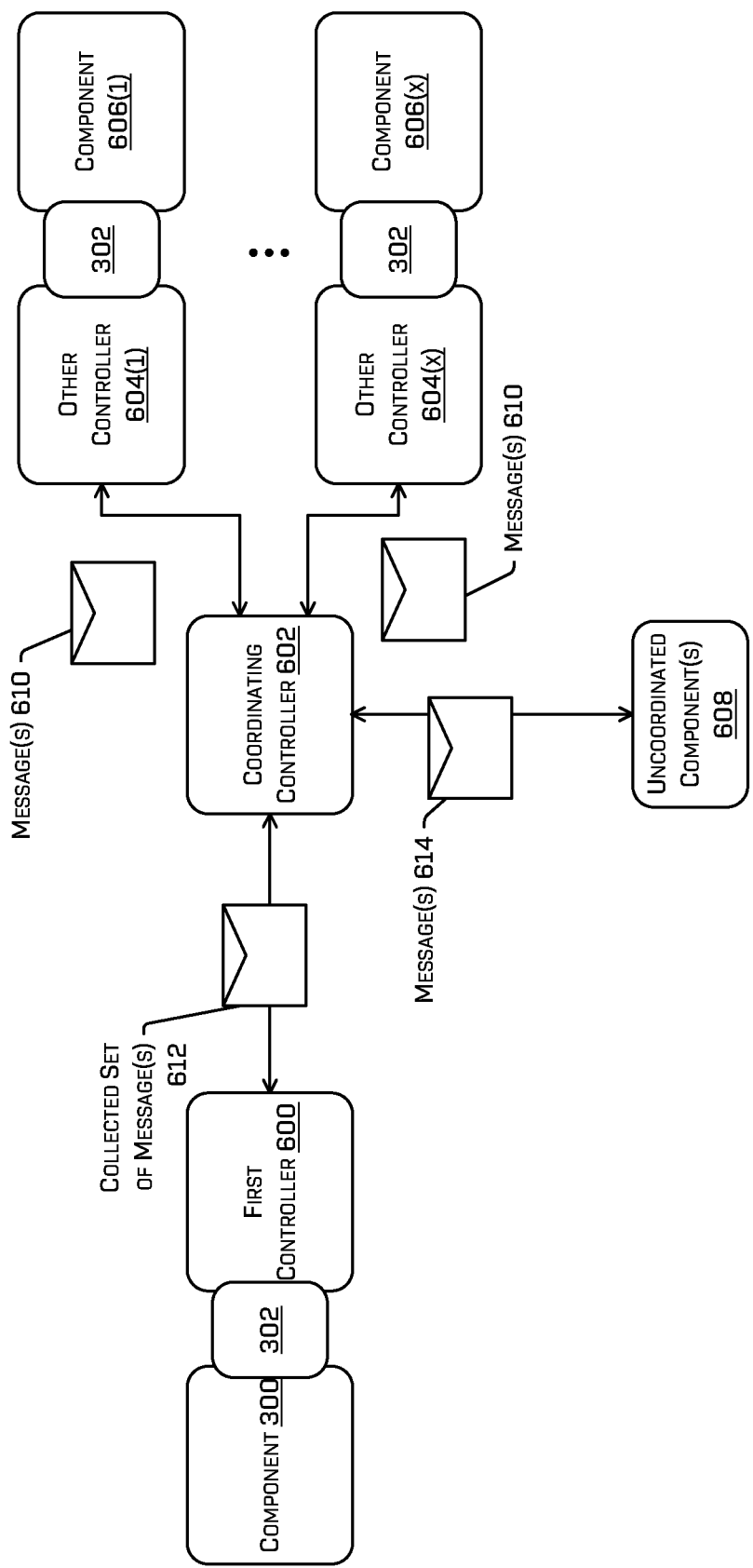
FIG. 6 illustrates a block diagram of a data pipeline execution system comprising a component, I/O interface, a coordinating controller, other controllers and components associated therewith, and uncoordinated component(s), in accordance with implementations of the disclosure.

FIG. 6 illustrates a block diagram of a framework implementation comprising a component 300, I/O interface 302, a first controller 600, a coordinating controller 602, other controller(s) 604(1)-(x) and components 606(1)-(x) associated therewith, and uncoordinated component(s) 608.

In some examples, coordinating controller 602 may coordinate actions between multiple controllers instead of being associated with a specific component. For example, the coordinating controller 602 may receive message(s) 610 from the other controller(s) 604(1)-(x) and may ensure that the message(s) 610 are routed to the appropriate subscriber(s). In some examples, at an instantiation of framework, the coordinating controller 602 may request a parameter set from the controllers (e.g., any of first controller 600 and/or other controller(s) 604(1)-(x)). The first controller 600 may generate the parameter set based at least in part on querying the component 300 to ascertain the input, execution, and/or output characteristics of the component 300. The first controller 600 may retain at least part of the input, execution, and/or output characteristics and may transmit, to the coordinating controller 602, a parameter set specify input(s) the component 300 uses to execute (e.g., other component(s) to which the component subscribes, message(s) the component 300 consumes, non-deterministic variable(s) the component 300 consumes), output(s) the component generates (e.g., a type of message, subscriber(s) to which the component 300 outputs messages), etc. For example, the input(s) the component 300 uses to execute may include an identifier of a set of messages and/or non-deterministic variables that the component 300 consumes to generate an output. The parameter set may further comprise delay times associated with the component 300 such as, for example, an initialization delay, an average execution time (at a given processing frequency), etc.

The parameter sets received from the controllers may be sufficient to configure the coordinating controller 602 to route messages between the controllers according to a data pipeline configuration. However, to further make the components agnostic to the data pipeline flow; the coordinating controller 602 may receive a configuration that specifies a data pipeline configuration. For example, the configuration may identify a pub-sub pattern defining the relative position of components/controllers to each other in the flow (e.g., the component(s) to which component 300 subscribes, the component(s) to which component 300 publishes).

Based at least in part on the parameter set and/or the configuration, a coordinating controller 602 may route message(s) 610 received from other controller(s) 604(1)-(x) to the appropriate subscribing controller(s). In some instances, the parameter set associated with component 300 may configure the coordinating controller 602 to collect message(s) identified as corresponding to a set of messages consumable by the component 300 as input for execution. The coordinating controller 602 may collect the message(s) until the coordinating controller 602 determines that the collected messages fulfill the set of messages at which time the coordinating controller 602 may transmit the collected set of message(s) 612 to the first controller 600 associated with component 300. In some examples, the coordinating controller 602 may additionally or alternatively delay and/or otherwise time publication of message(s) to the first controller 600 based at least in part on generation time(s) associated with the message(s), horizon time(s) associated with the message(s), and/or a sequence of events stored in a log file and/or provided by a user. For example, the coordinating controller 602 may comprise a timing model enforcer 504 that accomplishes substantially the same operations as discussed above, except that the coordinating controller 602 would not interact with an I/O interface 302 directly, but may rather transmit instructions and/or messages to the first controller 600, which may, in turn, provide messages and/or instructions to the component 300 via the I/O interface 302.

In some examples, the coordinating controller 602 may additionally or alternatively, exchange message(s) 614 with uncoordinated component(s) 608. The uncoordinated component(s) 608 may be deterministic component(s), may not include the I/O interface 302, and/or may not be associated with a controller other than the coordinating controller 602. In some examples, messages sent over the pub-sub network between the controllers may differ in format from messages sent between uncoordinated component(s) 608. Moreover, the uncoordinated component(s) 608 may exchange messages over a different channel and/or topic of the pub-sub network than coordinated components (e.g., component 300 and/or component(s) 606(1)-(x) in this example).

In some examples, the coordinating controller 602 may receive a message from a controller, determine that the message should be routed to an uncoordinated component (even if the message is formatted for a coordinated component), convert the message to an uncoordinated message type, and/or publish the converted message 614 to the uncoordinated component (e.g., via an uncoordinated component portion of a pub-sub architecture). In some examples, converting the message may comprise publishing the converted message over a second network channel and/or second topic when the original message was received over a first network channel and/or first topic and/or removing information pertinent to a coordinated component (e.g., removing a horizon time, removing instructions to interact with an I/O interface, removing references to the I/O interface). The coordinating controller 602 may inversely implement this process for message(s) received from the uncoordinated component(s) 608 (e.g., the coordinating controller 602 may associate a reception time with a message received from the uncoordinated component(s), the coordinating controller 602 may publish the message over a coordinated portion of the pub-sub architecture). In some examples, since the uncoordinated component(s) 608 are not associated with a controller, the coordinating controller 602 may determine a time at which to provide message(s) to the uncoordinated component(s) so that time-safety and/or message-safety is not violated at the uncoordinated component(s) 608.

In some examples, the coordinating controller 602 may conduct a discovery operation to discover a mapping of the data pipeline configuration by publishing parameter sets received from controller(s) associated with the coordinating controller 602 and receiving parameter sets from other coordinating controllers until parameter sets have been received from all other coordinating controllers.

Figure 7:
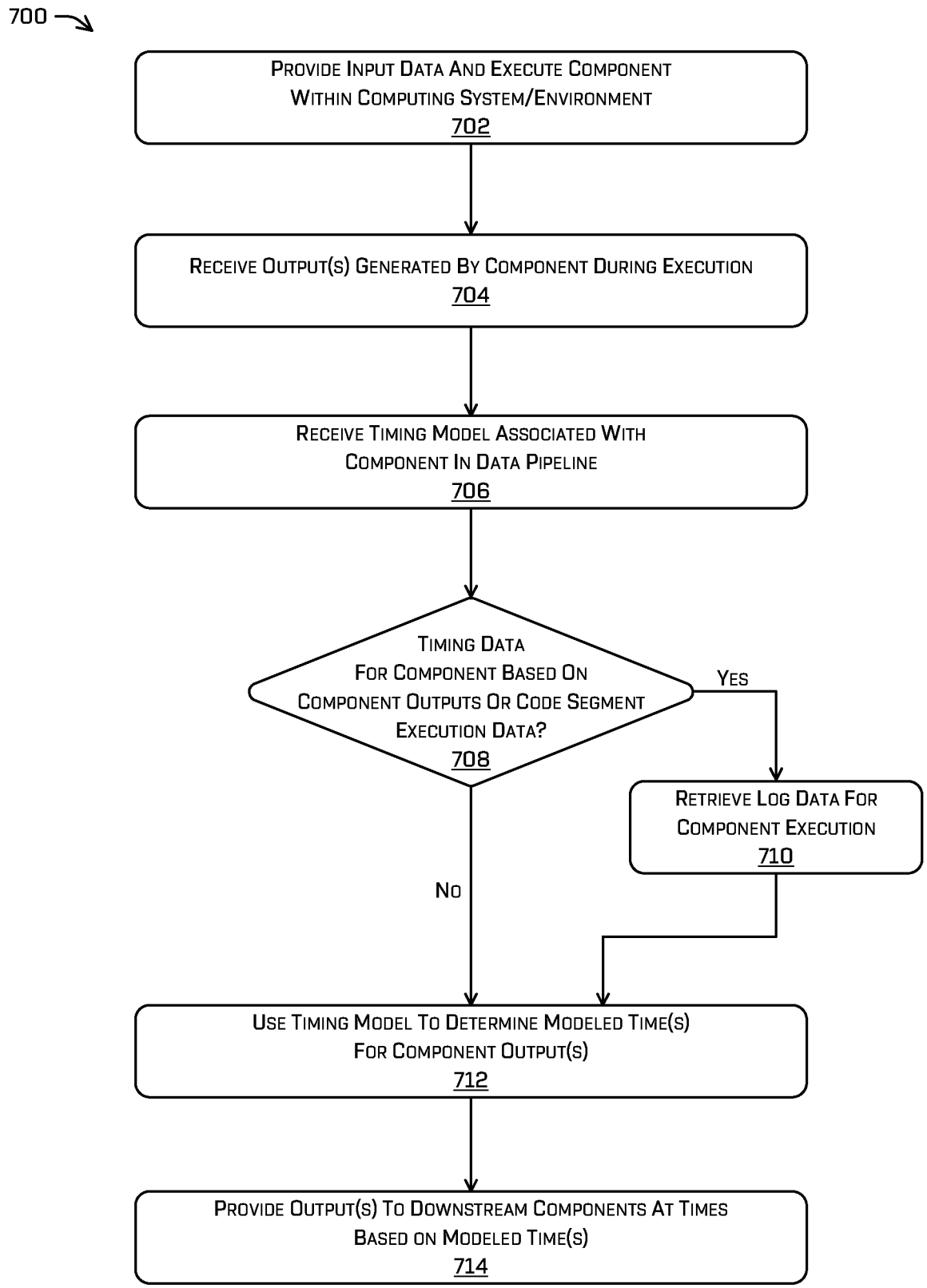
FIG. 7 illustrates a flow diagram of an example process of using a timing model to control the execution timing of components within a data pipeline, in accordance with implementations of the disclosure.

FIG. 7 is a flow diagram illustrating an example process 700 of receiving and using a timing model to control the execution timing of components in a data pipeline. The operations of process 700 may be performed by one or more computing systems configured to execute one or more components of a data pipeline, including receiving and analyzing timing models to determine timing data for controlling the times at which products are output from the components during execution. As described above, such systems may include but are not limited to simulation systems and other offline (or non-native) systems that may execute the components in various computing environments and configurations which may be different from than those in which the same components may be executed in online (or native) systems.

Process 700 is illustrated as a collection of blocks in a logical flow diagram, which represent a sequence of operations, some or all of which can be implemented in hardware, software, or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular abstract data types. The order in which the operations are described should not be construed as a limitation. Any number of the described blocks can be combined in any order and/or in parallel to implement the processes, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

At operation 702, a computing system (e.g., a simulation system 106 or other offline system) may execute one or more components of a data pipeline, including providing input values to the components. In some examples, operation 702 may comprise a simulation and/or software testing operation on the components of an autonomous vehicle system (e.g., a perception system, prediction system, and/or planning system). As described above, the computing system may include one or more controllers configured to receive input data from upstream components and/or other data sources, and to provide the input data as variables to the components so that execution of the components in operation 702 may be based at least in part on the input variables.

At operation 704, the computing system may receive one or more outputs (or products) generated by the components during the component executions initiated in operation 702. For instance, products output by a component of a data pipeline may be received by a controller of the computing system, such as a simulation system controller 500. In various implementations, the outputs received in operation 704 may include the programmatic outputs generated by the software of the components, and/or additional outputs such as the downstream components to which the outputs are to be provided, the communication channels (or topics) over which the outputs are to be provided, the times when the outputs were generated by the component, and/or instrumentation data indicating how many times various code segments executed during the execution of the components.

At operation 706, the computing system may receive the timing model(s) associated with the component(s) of the data pipeline executed in operation 702. As described above, various different times of timing models may be generated for components in different implementations, including timing models calculated based the product output times for a component and/or distributions of product output times for a component. In other examples, a timing model for a component may be based on the inputs provided to the component during previous executions, products output by the component during the previous executions, and/or how often particular code segments were executed during the previous executions. Additionally, a timing model for a component may include a single set of timing data (e.g., an average product output time or distribution of product output times), or may have multiple sets of timing data associated with different output channels/topics, etc.

At operation 708, the computing system determines whether the timing data for the component(s) can be generated without the results of the component executions, such as the component execution output data and the code segment execution data received from instrumented code. As discussed above, certain timing models may include timing data for product outputs that is based only the previous product output times for the component within the log data, and/or the inputs provided to the component in connection with the previous component executions. In such examples, the timing data for the component may be determined without component output data and/or code segment execution data (708: No). In such cases, the computing system might not retrieve or determine the component execution output data and/or code segment execution data in operation 704, as this data is not required by the timing models associated with the component(s). In contrast, if the timing models associated with the component(s) require component execution output data (e.g., number of outputs, output types, output channels, etc.) and/or the code segment execution data (708: Yes), then in operation 710 the log data associated with the component execution initiated in operation 702 may be retrieved to determine the required component execution output data and/or the code segment execution data.

At operation 712, the computing system may use the timing model associated with the components, to determine product output times for the components that may be used in simulations and/or other offline executions of the data pipeline. For instance, for timing models of certain components, the timing data based on the timing model may be single value, such as an average product output time. In such cases the computing system may use the average product output time as the time duration, from the beginning of the component execution, at which the component is to output a product for other downstream components in the pipeline. In other examples, the timing model for a component may include one or more probability distributions of product output times. In these examples, the computing system may sample from the appropriate probability distribution (e.g., a distribution based on the component, the output channel/topic, and/or other factors), and may use the sampled value as the time duration for the component to output a product for the other downstream components. As discussed below; the timing model(s) generated from components in other examples may be simpler or more complex, and may include multiple different averages and/or distributions corresponding to any combination of the input data factors and/or output data factors described herein.

In operation 714, the computing system may control the timing of the execution of the data pipeline, by providing the component outputs to the downstream components in the pipeline based on the modeled times determined in operation 712. In some examples, operation 714 may performed by a controller using a timing model enforcer 504 configured to cause the delay of output messages to downstream components in the pipeline, until the time duration determined in operation 712 has been reached. As this example illustrates, by using the timing models for components in the data pipeline, which are based on the log data for the components, to enforce the product output times of the components during simulations or other offline executions, the computing system may provide a higher level of behavioral similarity for the outputs and behaviors of the individual components and the data pipeline as a whole, in comparison to the same components executing within native systems and/or production environment.

Figure 8:
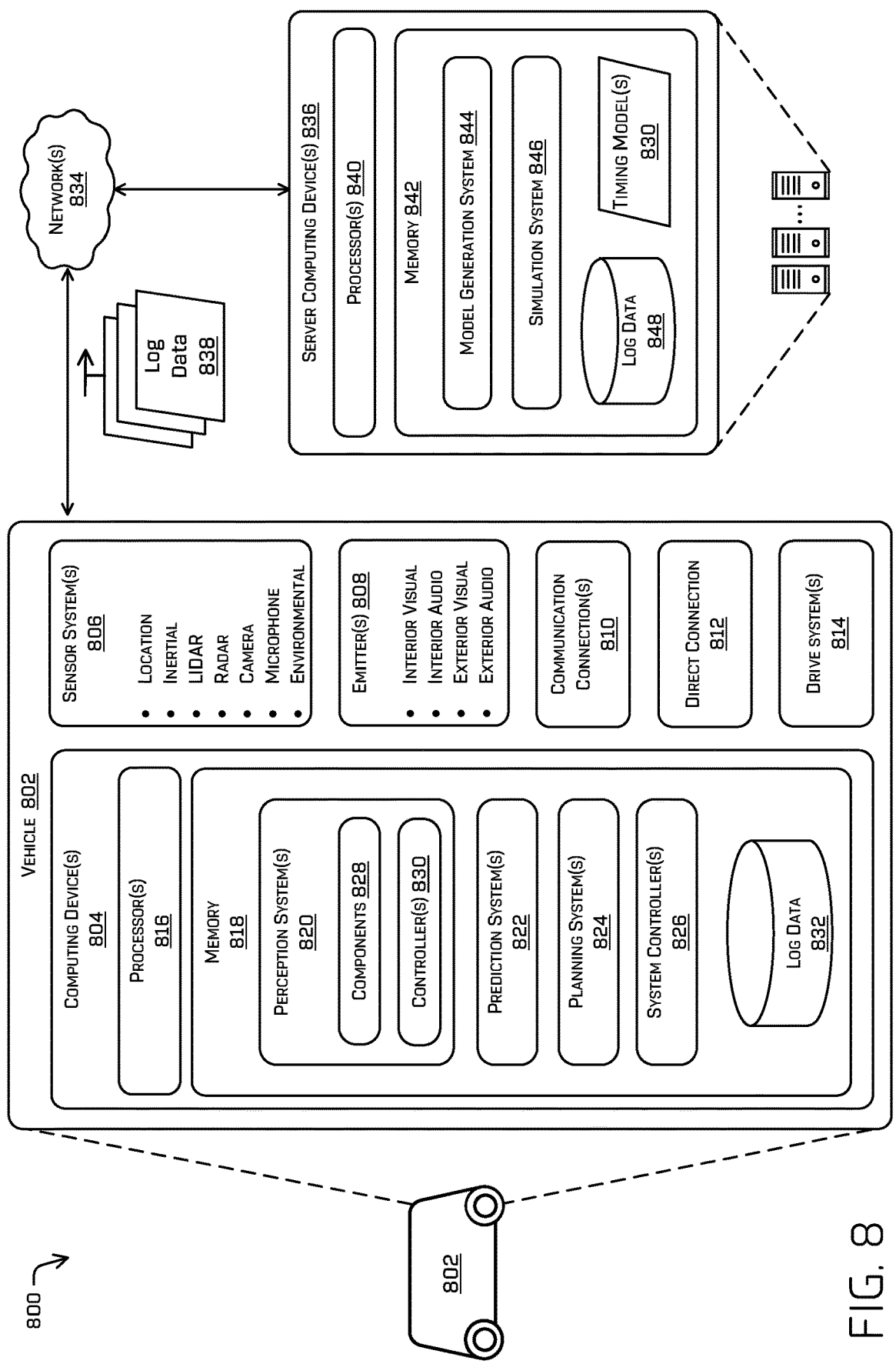
FIG. 8 illustrates a block diagram of an example architecture for implementing various techniques discussed herein.

FIG. 8 depicts a block diagram of an example system 800 for implementing the techniques discussed herein. In at least one example, the system 800 may include one or more vehicles 802, such as any autonomous vehicle (e.g., fully or semi-autonomous vehicle) discussed above. The vehicle 802 may include computing device(s) 804, one or more sensor system(s) 806, one or more emitter(s) 808, one or more communication connection(s) 810 (also referred to as communication devices and/or modems), at least one direct connection 812 (e.g., for physically coupling with the vehicle 802 to exchange data and/or to provide power), and one or more drive system(s) 814. The one or more sensor system(s) 806 may be configured to capture various sensor data associated with a surrounding physical environment.

In at least some examples, the sensor system(s) 806 may include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. In some examples, the sensor system(s) 806 may include multiple instances of each type of sensors. For instance, time-of-flight sensors may include individual time-of-flight sensors located at the corners, front, back, sides, and/or top of the vehicle 802. As another example, camera sensors may include multiple cameras disposed at various locations about the exterior and/or interior of the vehicle 802. In some cases, the sensor system(s) 806 may provide input to the computing device(s) 804.

The vehicle 802 may also include one or more emitter(s) 808 for emitting light and/or sound. The one or more emitter(s) 808 in this example include interior audio and visual emitters to communicate with passengers of the vehicle 802. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 808 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 802 can also include one or more communication connection(s) 810 that enable communication between the vehicle 802 and one or more other local or remote computing device(s) (e.g., a remote teleoperations computing device) or remote services. For instance, the communication connection(s) 810 can facilitate communication with other local computing device(s) on the vehicle 802 and/or the drive system(s) 814. Also, the communication connection(s) 810 may allow the vehicle 802 to communicate with other nearby computing device(s) (e.g., other nearby vehicles, traffic signals, etc.).

The communications connection(s) 810 may include physical and/or logical interfaces for connecting the computing device(s) 804 to another computing device or one or more external network(s) 834 (e.g., the Internet). For example, the communications connection(s) 810 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 810 may comprise the one or more modems as described above.

In at least one example, the vehicle 802 may include one or more drive system(s) 814. In some examples, the vehicle 802 may have a single drive system 814. In at least one example, if the vehicle 802 has multiple drive systems 814, individual drive systems 814 may be positioned on opposite ends of the vehicle 802 (e.g., the front and the rear, etc.). In at least one example, the drive system(s) 814 can include one or more sensor system(s) 806 to detect conditions of the drive system(s) 814 and/or the surroundings of the vehicle 802. By way of example and not limitation, the sensor system(s) 806 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders may be unique to the drive system(s) 814. In some cases, the sensor system(s) 806 on the drive system(s) 814 can overlap or supplement corresponding systems of the vehicle 802 (e.g., sensor system(s) 806).

The drive system(s) 814 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 814 can include a drive system controller which may receive and preprocess data from the sensor system(s) 806 and to control operation of the various vehicle systems. In some examples, the drive system controller can include one or more processor(s) and memory communicatively coupled with the one or more processor(s). The memory can store one or more modules to perform various functionalities of the drive system(s) 814. Further-more, the drive system(s) 814 also include one or more communication connection(s) that enable communication by the respective drive system with one or more other local or remote computing device(s).

The computing device(s) 804 may include one or more processors 816 and one or more memories 818 communicatively coupled with the processor(s) 816. In the illustrated example, the memory 818 of the computing device(s) 804 stores perception systems(s) 820, prediction systems(s) 822, planning systems(s) 824, as well as one or more system controller(s) 826. Though depicted as residing in the memory 818 for illustrative purposes, it is contemplated that the perception systems(s) 820, prediction systems(s) 822, planning systems(s) 824, as well as one or more system controller(s) 826 may additionally, or alternatively, be accessible to the computing device(s) 804 (e.g., stored in a different component of vehicle 802 and/or be accessible to the vehicle 802 (e.g., stored remotely).

As discussed above, the perception system 820 may be configured to perform object detection, segmentation, and/or classification on the sensor data captured by sensors system(s) 806. In some examples, the perception system 820 may generate and log processed perception data based on the sensor data. The perception data may indicate a presence of objects that are in physical proximity to the vehicle 802 and/or a classification or type of the objects (e.g., car, pedestrian, cyclist, building, tree, road surface, curb, sidewalk, unknown, etc.). In additional and/or alternative examples, the perception system 820 may generate or identify one or more attributes (or characteristics) associated with the objects and/or the physical environment. In various examples, the attributes associated with the detected objects may include, but are not limited to, an x-position, ay-position, a z-position, an orientation, a type (e.g., a classification), an x-velocity, a y-velocity, an x-size, a y-size, a z-size, a pose, a direction of travel, etc. Characteristics associated with the environment may include, but are not limited to, a presence of another object, a time of day, a weather condition, a geographic position, an indication of darkness/light, etc. For example, details of classification and/or segmentation associated with a perception system are discussed in U.S. application Ser. No. 15/820,245, which are herein incorporated by reference in their entirety.

The prediction system 822 may be configured to determine a track corresponding to an object identified by the perception system 820. For example, the prediction system 822 may be configured to predict a velocity, position, change in trajectory, or otherwise predict the decisions and movement of the identified objects. For example, the prediction system 822 may include one or more machine learned models that may, based on inputs such as object type or classification and object characteristics, output predicted characteristics of the object at one or more future points in time. For example, details of predictions systems are discussed in U.S. application Ser. Nos. 16/246,208 and 16/420,050, which are herein incorporated by reference in their entirety.

The planning system 824 may be configured to determine a route for the vehicle 802 to follow to traverse through an environment. For example, the planning system 824 may determine various routes and paths and various levels of detail based at least in part on the objects detected, the predicted characteristics of the object at future times, and a set of safety requirements corresponding to the current scenario (e.g., combination of objects detected and/or environmental conditions). In some instances, the planning system 824 may determine a route to travel from a first location (e.g., a current location) to a second location (e.g., a target location) in order to avoid an object obstructing or blocking a planned path of the vehicle 802. In some case, a route can be a sequence of waypoints for traveling between the two locations (e.g., the first location and the second location). In some cases, waypoints include streets, intersections, global positioning system (GPS) coordinates, etc. For example, details of path and route planning by the planning system are discussed in U.S. application Ser. Nos. 16/805,118 and 15/632,208, which are herein incorporated by reference, in its entirety.

In at least one example, the computing device(s) 804 may store one or more system controllers 826, which may be configured to control steering, propulsion, braking, safety, emitters, communication, and other systems of the vehicle 802. The system controllers 826 may communicate with and/or control corresponding systems of the drive system(s) 814 and/or other components of the vehicle 802, which may be configured to operate in accordance with a route provided from the planning system 824.

As noted above, various systems within the vehicle 802 may be implemented using data pipelines including multiple interacting components. For instance, in this example the perception systems(s) 820 includes components 828 and controllers 830 for implementing a data pipeline that uses one or more timing models as described herein. Although components 828 and controllers 830 are shown for the perception systems(s) 820 only in this example, it should be understood that additional data pipelines including components and/or controllers may be implemented within the prediction system(s) 822, planning system(s) 824, system controller(s) 826, and/or any other systems/subsystems within the vehicle 802.

Although component(s) 828 and controllers 830 are illustrated as being stored in memory 818, component(s) 828 and/or controllers 830 may include processor-executable instructions, machine-learned model(s) (e.g., a neural network), and/or hardware. In some examples, component(s) 828 that are to be coordinated in a data pipeline according to the systems discussed herein may be configured to include the I/O interface 302.

As described herein, an exemplary neural network is an algorithm which passes input data through a series of connected layers to produce an output. Each layer in a neural network can also comprise another neural network, or can comprise any number of layers (whether convolutional or not). As can be understood in the context of this disclosure, a neural network can utilize machine learning, which can refer to a broad class of such algorithms in which an output is generated based on learned parameters.

Although discussed in the context of neural networks, any type of machine learning can be used consistent with this disclosure. For example, machine learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet60, ResNet101, VGG, DenseNet, PointNet, and the like.

In some examples, the memory 818 also may store log data 832, which may include one or more log data files and/or databases. The log data 832 may include any combination of the log data described herein. For example, log data 832 may include data associated with the execution of any components (e.g., components 828) in data pipeline configurations with other components, in any systems of the vehicle 802. As discussed above, such log data 832 for the components may include the data indicating executions of the components, the inputs into the components, products output by the components, internal execution states of the components, indications of particular code segments executed by the components, and timing data associated with an component-related event.

In some implementations, the vehicle 802 may connect to server computing device(s) 836 via the network(s) 834. For example, the server computing device(s) 836 may receive transmissions of log data 838 from one or more vehicles 802. The log data may include any of the log data 832 captured by the vehicle systems, including but not limited to sensor data, perception data, prediction data, and/or a combination thereof.

One or more server computing device(s) 836 may include one or more processors 840) and memory 842 communicatively coupled with the one or more processors 840. In at least one instance, the processor(s) 840 may be similar to the processor(s) 816 and the memory 842 may be similar to the memory 818. In the illustrated example, the memory 842 of the server computing device(s) 836 stores the log data 838 received from one or more vehicles 802 The memory 842 may also store a model generation system 844, and a simulation system 846.

The model generation system 844 may be similar or identical to the model generation system 104 described above in reference to FIGS. 1-7. As discussed above, in some examples the model generation system 844 may analyze the log data 838 associated with particular components 828 executing in vehicles 802 and/or other online systems, to generate and/or train timing models 848 associated with the components 828. As discussed above, timing models 848 associated with components 828 may include timing data indicating times following the initiation of the execution that the components 828 may output products to downstream components via one or more channels. In various examples, timing models 848 may include statistical data (e.g., averages, probability distributions, etc.) and/or trained machine-learned models, based on various input data, output data, code segment execution data, etc.

The simulation system 846 may include be similar or identical to the simulation system 106 described above in reference to FIGS. 1-7. For example, simulation system 846 may be configured to retrieve one or more components operating in the vehicle 802, and execute the components within a separate (e.g., offline) computing environment. As discussed above, the simulation system 846 also may include one or more controllers configured to use timing data within timing models 848 to control the timing of component executions, and the timing of inputs provided to and outputs provided from components during simulations.

The processor(s) 816 of the computing device(s) 804 and the processor(s) 840 of the server computing device(s) 836 may be any suitable processor capable of executing instructions to process data and perform operations as described herein. By way of example and not limitation, the processor(s) 816 and 840 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 818 of the computing device(s) 804 and the memory 842 of the server computing device(s) 836 are examples of non-transitory computer-readable media. The memory 818 and 842 can store an operating system and one or more software applications, instructions, programs, and/ or data to implement the methods described herein and the functions attributed to the various systems. In various implementations, the memory 818 and 842 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 818 and 842 can be implemented as a neural network

EXAMPLE CLAUSES

A. A simulation system comprising: one or more processors; and memory storing: a plurality of components associated with an autonomous vehicle; and a controller associated with the simulation system and wherein the controller, when executed by the one or more processors, cause the simulation system to perform operations comprising: receiving a timing model associated with a first component of the plurality of components, wherein the timing model is based on log data determined during operation of the autonomous vehicle: executing the first component, wherein executing the first component comprises providing one or more inputs to the first component and initiating execution of the first component at a first time; receiving an output message from the first component at a second time, based at least in part on the execution of the first component and the one or more inputs: determining a modeled output time associated with the output message received from the first component, based at least in part on the timing model; and providing the output message received from the first component, as an input message to a second component of the plurality of components, at a third time after the second time, wherein the third time is based at least in part on the modeled output time.

B. The simulation system of paragraph A, wherein the timing model comprises a probability distribution of time durations associated with the output message, and wherein determining the modeled output time comprises sampling from the probability distribution of time durations.

C. The simulation system of paragraph A, wherein determining the modeled output time comprises: determining an input attribute of the one or more inputs provided to the first component, wherein the input attribute comprises at least one of a number of the one or more inputs, a channel associated with the one or more inputs, or a complexity of the one or more inputs; and using the timing model to determine the modeled output time, based at least in part on the input attribute.

D. The simulation system of paragraph A, wherein determining the modeled output time comprises: determining an output attribute associated with the output message; and using the timing model to determine the modeled output time, based at least in part on the output attribute.

E. The simulation system of paragraph A, wherein the timing model comprises: first timing data associated with the first component and a first communication channel supported by the simulation system: second timing data associated with the first component and a second communication channel supported by the simulation system: third timing data associated with the second component and the first communication channel; and fourth timing data associated with the second component and the second communication channel.

F. A method comprising: determining a timing model associated with a first component in a system, the timing model determined based on timing data corresponding to the first component: executing the first component, wherein executing the first component comprises providing one or more inputs to the first component and initiating execution of the first component at a first time: determining, based at least in part on the execution of the first component and the one or more inputs, an output of the first component: determining, based at least in part on the timing model, a time duration associated with the output of the first component; and outputting an output message including the output of the first component, to a second component at a second time, wherein the second time is based at least in part on the first time and the time duration associated with the output of the first component.

G. The method of paragraph F, wherein the timing model comprises an average time duration associated with the output of the first component, based on log data associated with the first component.

H. The method of paragraph F, wherein the timing model comprises a probability distribution of time durations associated with the output of the first component, and wherein determining the time duration comprises sampling from the probability distribution of time durations.

I. The method of paragraph F, wherein determining the output of the first component comprises receiving the output message at a time before the second time, and wherein outputting the output message comprises causing a delay in a transmission of the output message from the first component until the second time.

J. The method of paragraph F, wherein determining the time duration comprises: determining an input attribute of the one or more inputs provided to the first component, wherein the input attribute comprises at least one of a number of the one or more inputs, a channel associated with the one or more inputs, or a complexity of the one or more inputs; and using the timing model to determine the time duration, based at least in part on the input attribute.

K. The method of paragraph F, wherein determining the time duration comprises: receiving the output of the first component: determining an output attribute associated with the output of the first component; and using the timing model to determine the time duration, based at least in part on the output attribute.

L. The method of paragraph F, wherein determining the time duration comprises: determining a number of times that a code segment within the first component was executed during the execution of the first component; and using the timing model to determine the time duration, based at least in part on the number of times that the code segment was executed.

M. The method of paragraph F, wherein the system is configured to support communication via a first communication channel and a second communication channel, and wherein the timing model comprises at least one of: first timing data associated with the first component and the first communication channel, or second timing data associated with the first component and the second communication channel.

N. One or more non-transitory computer-readable media storing processor-executable instructions that, when executed by one or more processors, cause the one or more processors to perform operations comprising: determining a timing model associated with a first component in a system, the timing model determined based on timing data corresponding to the first component: executing the first component, wherein executing the first component comprises providing one or more inputs to the first component and initiating execution of the first component at a first time: determining, based at least in part on the execution of the first component and one or more inputs, an output of the first component: determining, based at least in part on the timing model, a time duration associated with the output of the first component; and outputting an output message including the output of the first component, at a second time, wherein the second time is based at least in part on the first time and the time duration associated with the output of the first component.

O. The non-transitory computer-readable media of paragraph N, wherein the timing model comprises an average time duration associated with the output of the first component, based on log data associated with the first component.

P. The non-transitory computer-readable media of paragraph N, wherein the timing model comprises a probability distribution of time durations associated with the output of the first component, and wherein determining the time duration comprises sampling from the probability distribution of time durations.

Q. The non-transitory computer-readable media of paragraph N, wherein determining the output of the first component comprises receiving the output message at a time before the second time, and wherein outputting the output message comprises causing a delay in a transmission of the output message from the first component until the second time.

R. The non-transitory computer-readable media of paragraph N, wherein determining the time duration comprises: determining an input attribute of the one or more inputs provided to the first component, wherein the input attribute comprises at least one of a number of the one or more inputs, a channel associated with the one or more inputs, or a complexity of the one or more inputs; and using the timing model to determine the time duration, based at least in part on the input attribute.

S. The non-transitory computer-readable media of paragraph N, wherein determining the time duration comprises: receiving the output of the first component; determining an output attribute associated with the output of the first component; and using the timing model to determine the time duration, based at least in part on the output attribute.

T. The non-transitory computer-readable media of paragraph N, wherein determining the time duration comprises: determining a number of times that a code segment within the first component was executed during the execution of the first component; and using the timing model to determine the time duration, based at least in part on the number of times that the code segment was executed.

While the example clauses described above are described with respect to particular implementations, it should be understood that, in the context of this document, the content of the example clauses can be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein. As can be understood, the components discussed herein are described as divided for illustrative purposes. However, the operations performed by the various components can be combined or performed in any other component. It should also be understood, that components or steps discussed with respect to one example or implementation may be used in conjunction with components or steps of other examples.

A non-limiting list of agents and other objects in an environment may include but is not limited to pedestrians, animals, cyclists, trucks, motorcycles, other vehicles, or the like. Such objects in the environment have a "geometric pose" (which may also be referred to herein as merely "pose") comprising a location and/or orientation of the overall object relative to a frame of reference. In some examples, pose may be indicative of a position of an object (e.g., pedestrian), an orientation of the object, or relative appendage positions of the object. Geometric pose may be described in two-dimensions (e.g., using an x-y coordinate system) or three-dimensions (e.g., using an x-y-z or polar coordinate system), and may include an orientation (e.g., roll, pitch, and/or yaw) of the object. Some objects, such as pedestrians and animals, also have what is referred to herein as "appearance pose." Appearance pose comprises a shape and/or positioning of parts of a body (e.g., appendages, head, torso, eyes, hands, feet, etc.). As used herein, the term "pose" refers to both the "geometric pose" of an object relative to a frame of reference and, in the case of pedestrians, animals, and other objects capable of changing shape and/or positioning of parts of a body. "appearance pose." In some examples, the frame of reference is described with reference to a two- or three-dimensional coordinate system or map that describes the location of objects relative to a vehicle. However, in other examples, other frames of reference may be used.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code modules and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A simulation system comprising:
one or more processors; and
memory storing:
a plurality of components associated with an autonomous vehicle; and
a controller associated with the simulation system and wherein the controller, when executed by the one or more processors, cause the simulation system to perform operations comprising:
receiving a timing model representing historical behavior of a first component of the plurality of components and comprising a distribution of time durations, wherein the timing model is generated based at least in part on log data associated with the first component determined during operation of the autonomous vehicle and at least one of:
a simulated first component temperature,
a simulated first component processor state,
a simulated first component input type,
a simulated first component input volume, or
a simulated first component operational state;
executing the first component, wherein executing the first component comprises providing one or more inputs to the first component and initiating execution of the first component at a first time;
receiving an output message from the first component at a second time, based at least in part on the execution of the first component and the one or more inputs;
using the timing model and the one or more inputs to determine a modeled output time associated with the output message received from the first component;
determining, based at least in part on the modeled output time, a delay; and
providing the output message received from the first component, as an input message to a second component of the plurality of components, at a third time after the second time at least by the delay.

2. The simulation system of claim 1, wherein the timing model comprises a probability distribution of time durations associated with the output message, and
wherein determining the modeled output time comprises sampling from the probability distribution of time durations.

3. The simulation system of claim 1, wherein determining the modeled output time further comprises:
determining an input attribute of the one or more inputs provided to the first component, wherein the input attribute comprises at least two of: a number of the one or more inputs, a channel associated with the one or more inputs, an identifier of an upstream component to the first component, or a complexity of the one or more inputs; and
using the timing model to determine the modeled output time, further based at least in part on the input attribute.

4. The simulation system of claim 1, wherein determining the modeled output time comprises:
determining an output attribute associated with the output message; and
using the timing model to determine the modeled output time, based at least in part on the output attribute.

5. The simulation system of claim 1, wherein the timing model comprises:
first timing data associated with the first component and a first communication channel supported by the simulation system;
second timing data associated with the first component and a second communication channel supported by the simulation system;
third timing data associated with the second component and the first communication channel; and
fourth timing data associated with the second component and the second communication channel.

6. A method comprising:
determining a timing model configured to reduce a difference between simulated and operational behavior of a first component in a vehicle, wherein the timing model comprises a distribution of time durations and the timing model is generated based at least in part on a first portion of log data determined during operation of the vehicle and simulated parameters, wherein the first portion of the log data is data associated with the first component and the simulated parameters are associated with simulated behavior of the first component;
executing the first component, wherein executing the first component comprises providing one or more inputs to the first component and initiating execution of the first component at a first time;
determining, based at least in part on the execution of the first component and the one or more inputs, an output of the first component at an output time;
determining, based at least in part on the timing model, a modeled time duration associated with the output of the first component, wherein the modeled time duration begins with the first time and comprises an end based at least in part on the first time and the timing model; and
outputting an output message including the output of the first component, to a second component at a second time, wherein determining the second time comprises adjusting the output time closer to the end of the modeled time duration.

7. The method of claim 6, wherein the timing model comprises an average time duration associated with the output of the first component, based on the first portion of log data being associated with the first component.

8. The method of claim 6, wherein the timing model comprises a probability distribution of time durations associated with the output of the first component, and
wherein determining the modeled time duration comprises sampling from the probability distribution of time durations.

9. The method of claim 6, wherein determining the output of the first component comprises receiving the output message at a time before the second time, and wherein outputting the output message comprises causing a delay in a transmission of the output message from the first component until the second time.

10. The method of claim 6, wherein determining the modeled time duration comprises:
   determining an input attribute of the one or more inputs provided to the first component, wherein the input attribute comprises at least one of a number of the one or more inputs, a channel associated with the one or more inputs, or a complexity of the one or more inputs; and
   using the timing model to determine the modeled time duration, based at least in part on the input attribute.

11. The method of claim 6, wherein determining the modeled time duration comprises:
   receiving the output of the first component;
   determining an output attribute associated with the output of the first component; and
   using the timing model to determine the modeled time duration, based at least in part on the output attribute.

12. The method of claim 6, wherein determining the modeled time duration comprises:
   determining a number of times that a code segment within the first component was executed during the execution of the first component; and
   using the timing model to determine the modeled time duration, based at least in part on the number of times that the code segment was executed.

13. The method of claim 6, further comprising configuring a system to support communication via a first communication channel and a second communication channel, and
   wherein the timing model comprises at least one of: first timing data associated with the first component and the first communication channel, or second timing data associated with the first component and the second communication channel.

14. One or more non-transitory computer-readable media storing processor-executable instructions that, when executed by one or more processors, cause the one or more processors to perform operations comprising:
   determining a timing model associated with a first component in a system, wherein the timing model comprises a distribution of time durations and is determined based on timing data and simulated parameters corresponding to the first component, wherein the timing data is a portion of log data determined during operation of a vehicle and the simulated parameters are associated with simulated behavior of the first component;
   executing the first component, wherein executing the first component comprises providing one or more inputs to the first component and initiating execution of the first component at a first time;
   determining, based at least in part on the execution of the first component and one or more inputs, an output of the first component;
   determining, based at least in part on the timing model, a time duration associated with the output of the first component; and
   outputting an output message including the output of the first component, at a second time, wherein the second time is based at least in part on the first time and the time duration associated with the output of the first component.

15. The non-transitory computer-readable media of claim 14, wherein the timing model comprises a probability distribution of time durations associated with the output of the first component, and
   wherein determining the time duration comprises sampling from the probability distribution of time durations.

16. The non-transitory computer-readable media of claim 14, wherein determining the output of the first component comprises receiving the output message at a time before the second time, and
   wherein outputting the output message comprises causing a delay in a transmission of the output message from the first component until the second time.

17. The non-transitory computer-readable media of claim 14, wherein determining the time duration comprises:
   determining an input attribute of the one or more inputs provided to the first component, wherein the input attribute comprises at least one of a number of the one or more inputs, a channel associated with the one or more inputs, or a complexity of the one or more inputs; and
   using the timing model to determine the time duration, based at least in part on the input attribute.

18. The non-transitory computer-readable media of claim 14, wherein determining the time duration comprises:
   determining a number of times that a code segment within the first component was executed during the execution of the first component; and
   using the timing model to determine the time duration, based at least in part on the number of times that the code segment was executed.

19. The simulation system of claim 1, the operations further comprising determining that the log data comprises a first portion and a second portion, the first portion associated with the first component; and
   wherein the timing model is generated based at least in part on the first portion and not the second portion.

20. The simulation system of claim 1, wherein the one or more inputs are substantially similar to historical inputs to a component of the autonomous vehicle with the first component.

* * * * *